US006495431B2

(12) United States Patent
Matsuzaki

(10) Patent No.: US 6,495,431 B2
(45) Date of Patent: Dec. 17, 2002

(54) SEMICONDUCTOR DEVICE AND METHOD FOR MANUFACTURING THE SAME THAT INCLUDES A DUAL OXIDATION

(75) Inventor: Tomokazu Matsuzaki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/919,921

(22) Filed: Aug. 2, 2001

(65) Prior Publication Data
US 2002/0053713 A1 May 9, 2002

(30) Foreign Application Priority Data
Aug. 3, 2000 (JP) .................................. 2000-236213

(51) Int. Cl.[7] .............................................. H01L 21/76
(52) U.S. Cl. ........................ 438/439; 438/444; 438/452
(58) Field of Search ............................... 438/439, 444, 438/452

(56) References Cited

U.S. PATENT DOCUMENTS 5,747,376 A * 5/1998 Lee ............................. 438/443
5,909,629 A * 6/1999 Manning ..................... 438/429
5,972,775 A * 10/1999 Chen .......................... 438/439

FOREIGN PATENT DOCUMENTS

| JP | 9-330922 | 12/1997 |
| JP | 9-330923 | 12/1997 |
| JP | 10-284477 | 10/1998 |

* cited by examiner

Primary Examiner—John F. Niebling
Assistant Examiner—Ron Pompey
(74) Attorney, Agent, or Firm—McGinn & Gibb, PLLC

(57) ABSTRACT

A first field oxidation is performed by masking an element-isolating region formation-expected region on a substrate by a first oxidation preventing film (silicon nitride film) having therein a first opening to thereby form a first field oxide film, which is then masked by a second oxidation preventing film (silicon nitride film) having a second opening with a smaller width dimension than the first opening in a second field oxidation to thereby locally form a second field oxide film at the middle of the first field oxide film.

16 Claims, 18 Drawing Sheets

- 3; silicon nitride film (oxidation preventing film)
- 2; silicon oxide film (pad insulating film)
- 1; silicon substrate

- 6A; opening
- 6; photo-resist film
- 4; element-isolating region formation-expected region

- 7; first opening
- 8; recess

- 9; first field oxide film
- 9A; bird's beak

4A; first element-isolating region formation-expected region

4B; second element-isolating region formation-expected region

8A; first recess

9; first field oxide film

4A; first element-isolating region formation-expected region

4B; second element-isolating region formation-expected region

25A; opening

27; first opening

28A; first recess

84; first field oxide film

85; second field oxide film

86; element region

94; first field oxide film

95; spacer

96; recess

97; second field oxide film

98; element region

SEMICONDUCTOR DEVICE AND METHOD FOR MANUFACTURING THE SAME THAT INCLUDES A DUAL OXIDATION

BACKGROUND OF THE INVENTION

1. Field of the Invention

The invention relates to a semiconductor device in which an element isolating region is formed using LOCOS (LOCal Oxidation of Silicon) and a method for manufacturing the same.

The present application claims priority of Japanese Patent Application No.2000-236213 filed on Aug. 3, 2000, which is hereby incorporated by reference.

2. Description of the Related Art

An LSI (Large Scale Integration) known as a representative of semiconductor devices includes desired circuit devices formed in each of a plurality of element regions which is dielectrically isolated from each other by an element isolating region on a semiconductor substrate. This element isolating region has conventionally been formed using LOCOS.

FIGS. 5A to 5C are flow diagrams for schematically showing an element isolating region forming method utilizing a LOCOS method.

As shown in FIG. 5A, first a silicon oxide ($SiO_2$) film 52 is formed as a pad insulating film by thermal oxidation and then a silicon nitride (SiN) film 53 is formed as an oxidation preventing film by CVD (Chemical Vapor Deposition) on a silicon substrate 51. In this configuration, oxidation preventing film, silicon oxide film 52, is used as a buffer film to prevent a crystal defect from occurring in a surface of the silicon substrate 51 if the silicon nitride film 53 is formed directly formed on the silicon substrate 51. Next, by photolithography, the silicon nitride film 53 is selectively etched away only in an element-isolating region formation-expected region 54 on the silicon substrate 51 to thereby expose the silicon oxide film 52.

Next, as shown in FIG. 5B, by performing thermal oxidation (field oxidation) on the silicon substrate 51 in an oxidizing atmosphere, a field silicon oxide film (field oxide film 55) is formed at such a position in the element-isolating region formation-expected region 54 that is not masked by the silicon nitride film 53. As a result, an element isolating region is formed which is made up of the field oxide film 55. Also, the field oxide film 55 has a so-called bird's beak 55A formed at its sides. Next, as shown in FIG. 5C, by removing the silicon nitride film 53 and the silicon oxide film 52, the silicon substrate 51 has, formed thereon, a plurality of element regions 56 which is dielectrically isolated from each other by the element isolating region made up of the field oxide film 55.

Afterwards, thus obtained silicon substrate 51 undergoes repeatedly such required process steps as impurity introduction and etching, so that desired circuit elements are formed in the element regions 56, thus completing a semiconductor device.

As mentioned above, the field oxide film 55 formed by LOCOS has the bird's beak 55A at its sides, which bird's beak 55A bites into the element region 56. Since a depth by which the bird's beak 55A bites into the element region 56 is roughly proportional to film thickness of the field oxide film 55, if the field oxide film 55 is formed thick to increase isolation dielectric strength of a circuit element formed in the element region 56, bite-in depth of the bird's beak 55A is also increased. As a result, a lateral dimension L of the element region 56 is decreased and will be more and more restricted as the LSIs will be demanded to have an even higher integration density in the future, thus leading to a major problem.

If the field oxide film 55 is formed thin to decrease the bite depth of the bird's beak 55A, on the other hand, the isolation dielectric strength is also decreased, thus finding difficulty in application to such a circuit element that requires a higher isolation dielectric strength. Thus, with the conventional element isolating region forming method using a LOCOS step only once, the bird's beak 55A cannot avoid biting deeply into the element region 56 particularly, when the element isolating region is formed rather thick.

Also, as the bird's beak 55A bites into the element region 56 deeper, it becomes more difficult to flatten the surface of the element region 56, so that when a MOS (Metal Oxide Semiconductor) transistor is formed as the circuit element in the element region 56, a channel region is not flattened in shape, thus resulting in fluctuations in effective lateral dimension L, hence in transistor characteristics.

It should be noted that such a semiconductor LSI device including a flash memory, for example, is widely used in information equipment or a like that includes a first type of circuit element that requires a higher isolation dielectric strength (supply voltage: 15–18V) like a memory transistor and a second type of circuit element that requires only a lower isolation dielectric strength (supply voltage: 2.5–3.3V) like a logic transistor in a peripheral circuit which are mixed on the same substrate. In such a configuration, the first type of circuit element requires a thicker element isolating region and the second type of circuit element, only a thinner one.

In manufacturing of such a semiconductor device, however, performing the LOCOS step only once is not sufficient to form an element isolating region that meets requirements of both types of circuit elements described above.

In view of the above, such a semiconductor device manufacturing method has conventionally been provided that forms an element isolating region by performing the LOCOS processing in two steps. The following will describe this semiconductor device manufacturing method along its steps with reference to FIGS. 6A to 6H. Description is made with reference to the above-mentioned example where the first type of circuit element requiring a thicker element isolating region and the second type of circuit element requiring only a thinner element isolating region are formed in a mixed manner on the same substrate.

First, as shown in FIG. 6A, on a silicon substrate 61 is formed by thermal oxidation, a silicon oxide film 62 as the pad insulating film with a film thickness of 18–22 nm, on which is then formed by CVD a silicon nitride film 63 as the oxidation preventing film with a film thickness of 130–170 nm. And, on the silicon substrate 61 are defined a first element-isolating region formation-expected region 64A for a first circuit element requiring a thicker element isolating region and a second element-isolating region formation-expected region 64B for a second circuit element requiring only a thinner element isolating region.

Next, as shown in FIG. 6B, a photo-resist is applied by photolithography everywhere on the silicon substrate 61, which is then exposed and developed to form a photo-resist (PR) film 66 having such a pattern that has an opening 66A therein with a width dimension of 700–750 nm only on the above-mentioned first element-isolating region formation-expected region 64A. Next, as shown in FIG. 6C, the silicon nitride film 63 and the silicon oxide film 62 which are exposed are sequentially and selectively dry-etched and patterned using the photo-resist film 66 as a mask to thereby form an opening 67 with roughly a same dimension as the opening 66A, thus exposing the silicon substrate 61. Subsequently, the silicon substrate 61 is selectively dry-etched on its surface to thereby form a recess 68 with roughly a same width dimension of 700–750 nm as the opening 67 and a depth of 70–80 nm. Next, the photo-resist film 66 is removed.

Next, as shown in FIG. 6D, the silicon substrate 61 is heat treated, as exposed in an oxidizing atmosphere, at 1000–1100° C. for 20–30 minutes as first field oxidation (thermal oxidation). This permits the silicon nitride film 63 having the opening 67 therein to be used as a mask to thereby form a first field oxide film 69 having a film thickness of 270–350 nm and a width of 1.0–1.3 $\mu$m constituting part of the first element isolating region on the surface of the silicon substrate 61 in which the recess 68 of the first element-isolating region formation-expected region 64A is formed. This first field oxide film 69 has a bird's beak 69A formed at its sides. When this first field is being formed, the second element-isolating region formation-expected region 64B is covered with the silicon nitride film 63, so that no field oxide film is formed. Note here that the silicon oxide film 62 is integrated with the first field oxide film 69.

Next, as shown in FIG. 6E, a photo-resist is applied by photolithography everywhere on the silicon substrate 61, which is then exposed and developed to thereby form a photo-resist film 71 having such a pattern that has an opening 71A with a width dimension of 330–390 nm only on the above-mentioned second element-isolating region formation-expected region 64B. Next, as shown in FIG. 6F, the exposed silicon nitride film 63 and the silicon oxide film 62 are selectively dry-etched and patterned in this order using the photo-resist film 71 as a mask to thereby form an opening 72 with roughly a same dimension as the opening 71A, thus exposing the silicon substrate 61. Subsequently, the surface of the silicon substrate 61 is selectively dry-etched to form a recess 73 having roughly a same width dimension of 330–390 nm as the opening 72 and a depth of 70–80 nm. Next, the photo-resist film 71 is removed.

Next, as shown in FIG. 6G, the silicon substrate 61 is heat treated, as exposed in an oxidizing atmosphere, at 1000–1100° C. for 30–40 minutes as second field oxidation (thermal oxidation). This permits the silicon nitride film 63 having the opening 67 therein to be used as a mask to thereby form a second field oxide film 74 with a film thickness of 450–500 nm so as to overlap with the first field oxide film 69 in the first element-isolating region formation-expected region 64A. As a result, in the first element-isolating region formation-expected region 64A is formed a first element isolating region 76 comprised of the first field oxide film 69 and the second field oxide film 74. At the same time, using as a mask the silicon nitride film 63 having the opening 72 therein, a third field oxide film 75 having a film thickness of 330–380 nm and a width of 0.6–0.8 $\mu$m is formed on the surface of the silicon substrate 61 in the recess 73 of the second element-isolating region formation-expected region 64B. This third field oxide film 75 provides a second element isolating region 78 and also has a bird's beak 75A at its sides.

Next, as shown in FIG. 6H, the silicon oxide film 62 and the silicon nitride film 63 are removed to thereby form such a silicon substrate 61 that has, formed thereon, a plurality of first element isolating regions dielectrically isolated from each other by the first element isolating region 76 made up of the first field oxide film (thin film) 69 and the second field oxide film (thick film) 74 and a plurality of second element regions 79 dielectrically isolated from each other by the second element isolating region 78 made up of the third field oxide film (thick film) 75.

The above-mentioned semiconductor device manufacturing method forms the element isolating region using LOCOS in two steps and so can form the first element isolating region 76 and the second element isolating region 78 that respectively meet the requirements of the first circuit element requiring a thicker element isolating region and the second circuit element only requiring a thinner element isolating region.

By this semiconductor device manufacturing method, however, when forming the first element isolating region 76 requiring an especially thick element isolating region, the silicon nitride film 63 having the opening 67 therein is used as a mask commonly for the first field oxidation shown in FIG. 6D for forming the first field oxide film (thin film) 69 and the second field oxidation shown in FIG. 6G for forming the second field oxide film (thick film) 74, so that the first and second field oxide films 69 and 74 spread laterally by almost the same width. Therefore, both bird's beaks 69A and 74A inevitably bite deep into a first element region 77.

The semiconductor device manufacturing method for forming the element isolating region using LOCOS in two steps is disclosed, for example, in Laid-open Japanese Patent Application No. Hei 9-330922. By this semiconductor device manufacturing method, as shown in FIG. 7A, first a pad oxide film 82 and a nitride film 83 are patterned and formed on a semiconductor substrate 81 and then, using the nitride film 83 as a mask, a first thermal oxidation is performed to form a thicker first field oxide film 84. Next, as shown in FIG. 7B, the nitride film 83 is etched using, for example, phosphoric acid to remove the pad oxide film 82 using, for example, BOE (Buffered Oxide Etchant) in order to reduce a size of both films 83 and 82, thus exposing the semiconductor substrate 81. Next, as shown in FIG. 7C, a second thermal oxidation is performed using thus small-sized nitride film 83 as a mask to thereby form a thinner second field oxide film 85 on the above-mentioned exposed surface. Next, as shown in FIG. 7D, the nitride film 83 and the pad oxide film 82 are removed to thereby obtain such the semiconductor substrate 81 that has, formed thereon, a plurality of element regions 86 dielectrically isolated from each other by an element isolating region made up of the thicker first field oxide film 84 and the thinner second field oxide film 85.

Another semiconductor device manufacturing method for likewise forming the element isolating region using LOCOS in two steps is disclosed, for example, in Japanese Laid-open Patent Application No. Hei9-330923.

By this semiconductor device manufacturing method, which employs a so-called fully recessed LOCOS method, as shown in FIG. 8A, first on a semiconductor substrate 91 is formed by patterning an oxidation preventing film pattern 93 which has therein an opening $T_2$ formed by a pad oxide film 92 and a nitride film, which oxidation preventing film pattern 93 is then used as a mask to perform a first thermal oxidation to thereby form a first field oxide film 94 on the semiconductor substrate 91 at a lower part of the pad oxide film 92 exposed through the opening $T_2$. At sides of this first field oxide film 94 is formed a bird's beak 94A. Next, as shown in FIG. 8B, on a side wall of the oxidation preventing film pattern 93 is formed a spacer 95 made of a nitride film.

And then, by using both oxidation preventing film pattern 93 and spacer 95 as a mask, in the first field oxide film 94 is formed a recess 96 which is shallower than thickness of the first field oxide film 94 as shown in FIG. 8C. Alternatively, this recess 96 may well be formed throughout on all thicknesses of the first field oxide film 94.

Next, as shown in FIG. 8D, a second thermal oxidation is performed using the oxidation preventing film pattern 93 and the spacer 95 to oxidize the first field oxide film 94 having the recess 96 formed therein in order to form a second field oxide film 97 thicker than the first field oxide film 94 at a position corresponding to an opening in the spacer 95. Next, as shown in FIG. 8E, the pad oxide film 92 and the oxidation preventing film pattern 93 are removed to obtain such the semiconductor substrate 91 that has, formed thereon, a plurality of element regions 98 dielectrically isolated from each other by an element isolating region made up of the thinner first field oxide film 94 and the thicker second field oxide film 97.

By the above-mentioned semiconductor device manufacturing method, especially, the spacer 95, which is formed on the side wall of the oxidation preventing film pattern 93, can suppress bite-in of the bird's beak 94A when the second field oxide film 97 is formed by the second thermal oxidation, thus preventing the bird's beak 94A from biting deep into the element region 98.

Also, still another semiconductor device manufacturing method forming the element isolating region using LOCOS in two steps is disclosed, for example, in Japanese Laid-open Patent Application No. Hei 10-284477.

By this semiconductor device manufacturing method, as shown in FIG. 9A, first on a semiconductor substrate 101 is formed by patterning a nitride film 103 having a pad oxide film 102 and an opening 103A, which nitride film 103 is then used as a mask to perform a first thermal oxidation to form a first field oxide film 104 on the semiconductor substrate 101 at a lower part of the pad oxide film 102 exposed through the opening 103A. Next, as shown in FIG. 9B, for example, RIE (Reactive In Etching) is performed using the nitride film 103 having the opening 103A therein as a mask to selectively etch the first field oxide film 104, thus forming an opening 105 penetrating through the first field oxide film 104. Alternatively, this opening 105 may not penetrate through the first field oxide film 104, thus forming a remaining film.

Next, as shown in FIG. 9C, a second thermal oxidation is performed using the nitride film 103 having the opening 103A therein as a mask to thereby oxidize the first field oxide film 104 having the opening 105 formed therein, thus forming a second field oxide film 106. Next, as shown in FIG. 9D, the nitride film 103 is removed to thereby obtain such the semiconductor substrate 101 that has, formed thereon, a plurality of element regions 108 dielectrically isolated from each other by an element isolating region made up of the first field oxide film 104 and the second field oxide film 106. By this semiconductor device manufacturing method, it is possible to form a thick element isolating region made up of the first field oxide film 104 and the second field oxide film 106, thus maintaining sufficiently good isolation between the element regions even with a small distance between the element isolating regions.

The prior art semiconductor device manufacturing methods disclosed in the above two publications for forming the element isolating region using LOCOS in two steps have such respective problems as follows.

First, by the semiconductor device manufacturing method disclosed in Japanese Laid-open Patent Application No. Hei 9-330922, as shown in FIGS. 7A to 7D, the nitride film 83 used as an oxidation preventing mask when forming the first field oxide film 84 is reduced in size by wet etching after the first field oxide film 84 is formed to thereby reserve the exposed surface of the semiconductor substrate 81, on which the second field oxide film 85 is then formed, so that the element isolating region has a width as much as the first field oxide film 84 plus the second field oxide film 85. Therefore, an inside region of the first field oxide film 84 which can be used as the element region 86 originally is occupied by the second field oxide film 85, thus resulting in a disadvantage of reduced lateral dimension of the element region 86.

By the next semiconductor device manufacturing method disclosed in Japanese Laid-open Patent Application No. Hei 9-330923, as shown in FIGS. 8A to 8E, the fully recessed LOCOS method is applied in a premise, so that the spacer 95 made of a nitride film is formed on the side wall of the oxidation preventing film pattern 93 used when forming the first field oxide film 94 prior to the second thermal oxidation. Then, this spacer 95 is used as part of the oxidation preventing film in the second thermal oxidation to thereby form the second field oxide film 97. To thus form the spacer 95 made of the nitride film on the side wall of the oxidation preventing film pattern 93, however, prior to the formation of the second field oxide film 97, such extra steps are required as forming an nitride film thoroughly and processing this nitride film into the spacer 95, thus resulting in a disadvantage of an increased number of steps required in manufacturing. Further, there also occur such a disadvantage that a bird's beak 94A bites into the thick field oxide film and such another disadvantage that a photolithography process results in a small distance between a photo-resist film edge and a oxide film edge.

Next, by the semiconductor device manufacturing method disclosed in Japanese Laid-open Patent Application No. Hei 10-284477, as shown in FIGS. 9A to 9D, the nitride film 103 having the opening 103A therein is used as an oxidation preventing film commonly in both oxidation steps for formation of the first field oxide film 104 and the second field oxide film 106, so that as in the case of the prior art described with reference to FIGS. 6A to 6H, the first and second field oxide films 104 and 106 spread laterally by roughly the same width. Therefore, this method has a disadvantage that the bird's beak of the first and second field oxide films inevitably bites deep into the element region 108. Further, it has a disadvantage that the bird's beak bites deep into a thick field oxide film as well as another disadvantage that a photolithography process results in a small distance between a photo-resist film edge and an oxide film edge.

SUMMARY OF THE INVENTION

In view of the above, it is an object of the invention to provide a semiconductor device in which bite-in of a bird's beak into an element region can be suppressed to flatten the surface of the element region when an element isolating region is formed using LOCOS in two steps and a method for manufacturing the same.

According to a first aspect of the present invention, there is provided a semiconductor device manufacturing method for selectively forming an element isolating region on a semiconductor substrate so that the semiconductor substrate may be dielectrically isolated into a plurality of element regions by the element isolating region, including:

a first oxidation preventing film forming step of covering an element-isolating region formation-expected region on the semiconductor substrate with a first oxidation preventing film having a first opening therein;

a first field oxide film forming step of performing first field oxidation on the semiconductor substrate to thereby selectively form a first field oxide film at such a position in the element-isolating region formation-expected region that is not covered with the first oxidation preventing film;

a second oxidation preventing film forming step of removing the first oxidation preventing film to then cover the first field oxide film with a second oxidation preventing film having a second opening having a set width dimension smaller than the first opening; and a second field oxide film forming step of performing second field oxidation on the semiconductor substrate to thereby selectively form a second field oxide film which overlaps partially with the first field oxide film and also which is located deeper in level than the first field oxide film at such a position in the element-isolating region formation-expected region that corresponds to the second opening in the second oxidation preventing film.

In the foregoing first aspect, a preferable mode is one that wherein further including a recess forming step of using the first oxidation preventing film as a mask to thereby form a recess in the first element-isolating region formation-expected region between the first oxidation preventing film forming step and the first field oxide film forming step.

Also, a preferable mode is one wherein the recess can be changed in formation arbitrarily in width and depth.

According to a second aspect of the present invention, there is provided a semiconductor device manufacturing method for selectively forming a first element isolating region with a larger film thickness and a second element isolating region with a smaller film thickness on a semiconductor substrate so that the semiconductor substrate may be dielectrically isolated into a plurality of element regions by the first element isolating region and second element isolating region, including:

a first oxidation preventing film forming step of covering a first element-isolating region formation-expected region and a second element-isolating region formation-expected region on the semiconductor substrate with a first oxidation preventing film having a first opening therein in such a way that the first opening may be located above the first element-isolating region formation-expected region;

a first field oxide film forming step of performing first field oxidation on the semiconductor substrate to thereby selectively form a first field oxide film only at such a position in the first element-isolating region formation-expected region that is not covered with the first oxidation preventing film;

a second oxidation preventing film forming step of removing the first oxidation preventing film to then cover the semiconductor substrate with a second oxidation preventing film having a second opening and a third opening which have set width dimensions smaller than the first opening in such a way that the second opening may be located above the first field oxide film and also that the third opening may be located above the second element-isolating region formation-expected region; and a second and third field oxide films forming step of performing second field oxidation on the semiconductor substrate to thereby selectively form a second field oxide film which overlaps partially with the first field oxide film and also which is located deeper in level than the first field oxide film only at such a position in the first element-isolating region formation-expected region that corresponds to the second opening in the second oxidation preventing film and, at the same time, selectively forms a third field oxide film only at such a position in the second element-isolating region formation-expected region that corresponds to the third opening.

According to a third aspect of the present invention, there is provided a semiconductor device manufacturing method for selectively forming an element isolating region on a semiconductor substrate so that the semiconductor substrate may be dielectrically isolated into a plurality of element regions by the element isolating region, including:

a first oxidation preventing film forming step of covering an element-isolating region formation-expected region on the semiconductor substrate with a first oxidation preventing film having a first opening therein;

a first field oxide film forming step of performing first field oxidation on the semiconductor substrate to thereby selectively form a first field oxide film at such a position in the element-isolating region formation-expected region that is not covered with the first oxidation preventing film;

a second oxidation preventing film forming step of removing the first oxidation preventing film to then cover the first field oxide film with a second oxidation preventing film having a second opening therein which has a set width dimension larger than the first opening; and a second field oxide film forming step of performing second field oxidation on the semiconductor substrate to thereby selectively form a second field oxide film which overlaps partially with the first field oxide film and also which is located shallower in level than the first field oxide film at such a position in the element-isolating region formation-expected region that corresponds to the second opening in the second oxidation preventing film.

According to a fourth aspect of the present invention, there is provided a semiconductor device manufacturing method for selectively forming a first element isolating region with a larger film thickness and a second element isolating region with a smaller film thickness on a semiconductor substrate so that the semiconductor substrate may be dielectrically isolated into a plurality of element regions by the first element isolating region and second element isolating region, including:

a first oxidation preventing film forming step of covering a first element-isolating region formation-expected region and a second element-isolating region formation-expected region on the semiconductor substrate with a first oxidation preventing film having a first opening therein in such a way that the first opening may be located above the first element-isolating region formation-expected region;

a first field oxide film forming step of performing first field oxidation on the semiconductor substrate to thereby selectively form a first field oxide film only at such a position in the first element-isolating region formation-expected region that is not covered with the first oxidation preventing film;

a second oxidation preventing film forming step of removing the first oxidation preventing film to then cover the semiconductor substrate with a second oxidation preventing film having a second opening and a third opening which have set width dimensions larger than the first opening in such a way that the second opening may be located above the first field oxide film and also that the third opening may be located above the second element-isolating region formation-expected region; and a second and third field oxide films forming step of performing second field oxidation on the semiconductor substrate to thereby selectively form a second field oxide film which overlaps partially with the first field oxide film and also which is located shallower in level than the first field oxide film only at such a position in the first element-isolating region formation-expected region that corresponds to the second opening in the second oxidation preventing film and, at the same time, selectively form a third field oxide film only at such a position in the second element-isolating region formation-expected region that corresponds to the third opening.

In the foregoing second aspect, a preferable mode is one that wherein further including another recess forming step of using the second oxidation preventing film as a mask to thereby form another recess in the second element-isolating region formation-expected region between the second oxidation preventing film forming step and the second and third field oxide films forming step.

Also, a preferable mode is one wherein the recess can be changed in formation arbitrarily in width and depth.

According to a fifth aspect of the present invention, there is provided a semiconductor device in which a semiconductor substrate thereof is dielectrically isolated into a plurality of element regions by an element isolating region which is selectively formed on the semiconductor substrate, wherein the element isolating region includes:

a first field oxide film which is selectively formed at such a position in an element-isolating region formation-expected region that is not covered with a first oxidation preventing film having a first opening therein; and a second field oxide film which is selectively formed at such a position in the element-isolating region formation-expected region that is not covered with a second opening of a second oxidation preventing film having the second opening with a smaller width dimension than the first opening and also which is locally formed so as to be thicker at around a middle of the first field oxide film.

According to a sixth aspect of the present invention, there is provided a semiconductor device in which a first element isolating region with a larger film thickness and a second element isolating region with a smaller film thickness are selectively formed on a semiconductor substrate so that the semiconductor substrate may be dielectrically isolated into a plurality of element regions by the first element isolating region and second element isolating region, wherein:

the first element isolating region includes a first field oxide film which is selectively formed at such a position in a first element-isolating region formation-expected region that is not covered with a first oxidation preventing film having a first opening and a second field oxide film which is selectively formed at such a position in the first element-isolating region formation-expected region that is not covered with a second opening of a second oxidation preventing film having the second opening with a smaller width dimension than the first opening and also which is locally formed so as to be thicker at around a middle of the first field oxide film; and the second element isolating region includes a third field oxide film which is selectively formed at such a position in a second element-isolating region formation-expected region that is not covered with the second oxidation preventing film having a third opening.

According to a seventh aspect of the present invention, there is provided a semiconductor device in which a semiconductor substrate thereof is dielectrically isolated into a plurality of element regions by an element isolating region which is selectively formed on the semiconductor substrate, wherein the element isolating region includes:

a first field oxide film which is selectively formed at such a position in an element-isolating region formation-expected region that is not covered with a first oxidation preventing film having a first opening therein; and a second field oxide film which is selectively formed at such a position in the element-isolating region formation-expected region that is not covered with a second oxidation preventing film having therein a second opening with a larger width dimension than the first opening and which overlaps partially with the first field oxide film and also which is formed shallower in level than the first field oxide film.

Also, according to an eighth aspect of the present invention, there is provided a semiconductor device in which a first element isolating region with a larger film thickness and a second element isolating region with a smaller film thickness are selectively formed on a semiconductor substrate so that the semiconductor substrate may be dielectrically isolated into a plurality of element regions by the first element isolating region and second element isolating region, wherein:

the first element isolating region includes a first field oxide film which is selectively formed at such a position in a first element-isolating region formation-expected region that is not covered with a first oxidation preventing film having a first opening therein and a second field oxide film which is selectively formed at such a position in the first element-isolating region formation-expected region that is not covered with a second opening of the second oxidation preventing film having a second opening with a larger width dimension than the first opening; and the second element isolating region includes a third field oxide film which is selectively formed at such a position in a second element-isolating region formation-expected region that is not covered with the second oxidation preventing film having a third opening.

With the above configurations drawn to the semiconductor device manufacturing method, on the substrate, an element-isolating region formation-expected region is masked by a first oxidation preventing film having a first opening therein in the first field oxidation to thereby form a first field oxide film, which is then masked by a second oxidation preventing film having a second opening therein having a set width dimension smaller than the first opening in the second field oxidation to thereby locally form a second field oxide film at around the middle of the first field oxide film, thus enabling arbitrarily controlling the film thickness of the element isolating region around the element region.

Also, with the above configurations drawn to the semiconductor device, a plurality of element regions is dielectrically isolated from each other by an element isolating region selectively formed on the silicon substrate, which element isolating region includes a first field oxide film which is selectively formed at a position not covered with a first oxidation preventing film having a first opening therein of an element-isolating region formation-expected region and a second field oxide film which is selectively formed at a position not covered with a second oxidation preventing film having a second opening therein with a smaller width dimension than the first opening of the element-isolating region formation-expected region and also which is locally formed so as to be thicker at around the middle of the first field oxide film, thus enabling formation the element isolating region having an arbitrary film thickness.

Thus, when the element isolating region is formed by LOCOS in two steps, the bird's beak can be suppressed from biting deep into the element region, thus flattening the surface of that element region.

BRIEF DESCRIPTION OF THE DRAWINGS

The above and other objects, advantages, and features of the invention will be more apparent from the following description taken in conjunction with the accompanying drawings, in which.

DESCRIPTION OF THE PREFERRED EMBODIMENTS

The following will describe embodiments of the invention with reference to the drawings.

The description is made specifically with reference to the embodiments.

First Embodiment

The following will describe a semiconductor device manufacturing method according to the first embodiment along its steps with reference to FIGS. 1A to 1J. Specifically, this embodiment is explained with reference to an example of forming a circuit element which requires a thicker element isolating region on a silicon substrate.

Figure 1A:
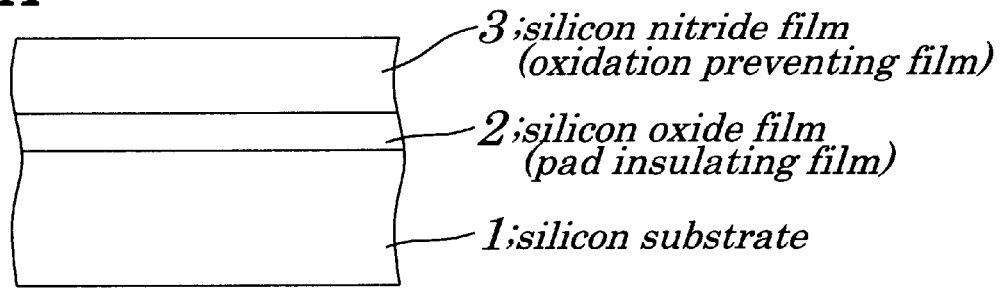
FIGS. 1A to 1D are flow diagrams for sequentially showing steps, in configuration, of a semiconductor device manufacturing method according to a first embodiment of the invention.

First, as shown in FIG. 1A, on a silicon substrate 1 is formed a silicon oxide film 2 as a pad insulating film with a film thickness of 18–22 nm by thermal oxidation and then is formed a silicon nitride film 3 as an oxidation preventing film with a film thickness of 130–170 nm by CVD.

Figure 1B:
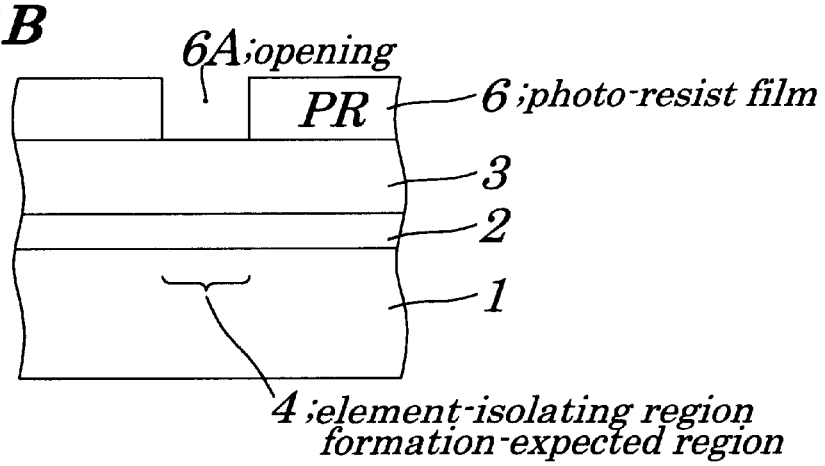

Next, as shown in FIG. 1B, a photo-resist is applied throughout on a surface by photolithography and then exposed and developed to thereby form a photo-resist film 6 in which an opening 6A with a width dimension of 700–750 nm only above the element-isolating region formation-expected region 4.

Figure 1C:
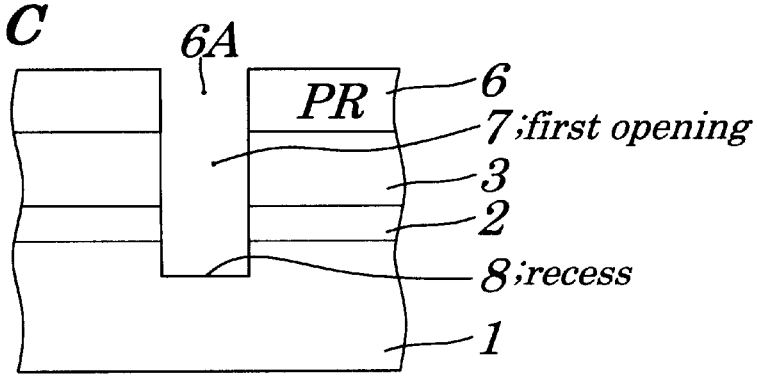

Next, as shown in FIG. 1C, using the photo-resist film 6 as a mask, exposed silicon nitride film 3 and the silicon oxide film 2 are selectively dry-etched and patterned in this order to thereby form a first opening 7 having roughly a same dimension as the opening 6A, thus exposing the silicon substrate 1. Subsequently, the surface of the silicon substrate 1 is selectively dry-etched to thereby form a recess 8 having roughly a same width dimension of 700–750 nm as the first opening 7 and a depth of 70–80 nm. Next, the photo-resist film 6 is removed. In this step, the first recess 8 can be arbitrarily formed in width and depth dimensions.

Figure 1D:
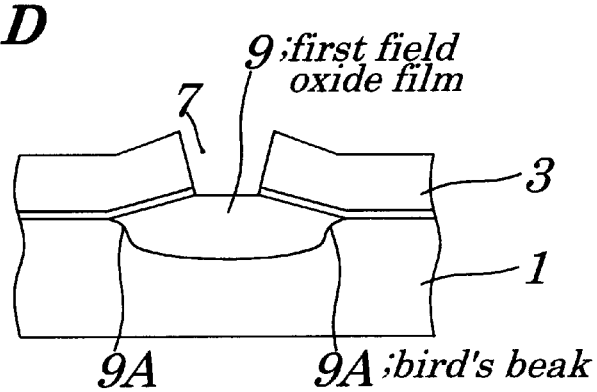

Next, as shown in FIG. 1D, the silicon substrate 1 is heat treated, as exposed in an oxidizing atmosphere, at 1000–1100° C. for 20–30 minutes as a first field oxidation. This permits the silicon nitride film 3 having the first opening 7 therein to be used as a mask to thereby form a first field oxide film 9 having a film thickness of 270–350 nm and a width of 1.0–1.3 μm which constitutes part of an element isolating region on the surface of the silicon substrate 1 in which the recess 8 of the element-isolating region formation-expected region 4. This first field oxide film 9 has a bird's beak 9A formed at its sides. In this step, the silicon oxide film 2 is integrated with the first field oxide film 9.

Figure 1E:
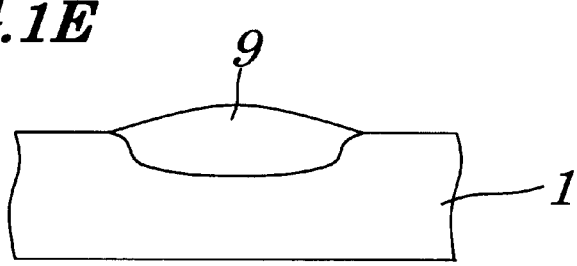
FIGS. 1E to 1G are continued flow diagrams for sequentially showing the steps of the semiconductor device manufacturing method according to the first embodiment of the invention.
Figure 1F:
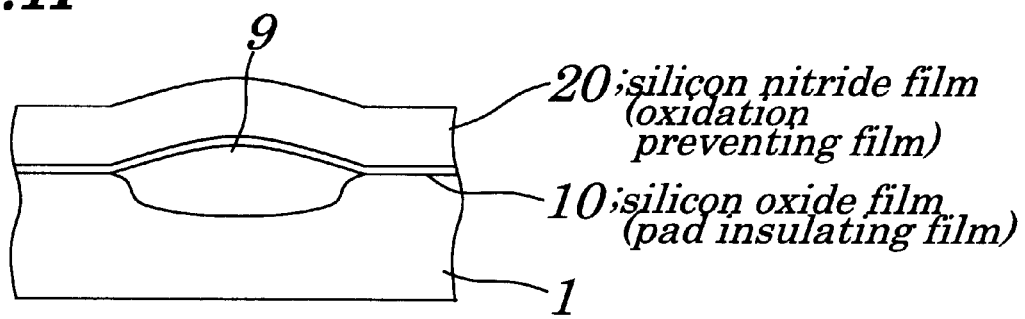

Next, as shown in FIG. 1E, the silicon oxide film 2 and the silicon nitride film 3 are removed by dry-etching to then perform almost the same processing as that of FIG. 1A, thus newly forming a silicon oxide film 10 with a film thickness of 18–22 nm as the pad insulating film and a silicon nitride film 20 with a film thickness of 130–170 nm as the oxidation preventing film on the silicon substrate 1 including the first field oxide film 9 thereon as shown in FIG. 1F.

Figure 1G:
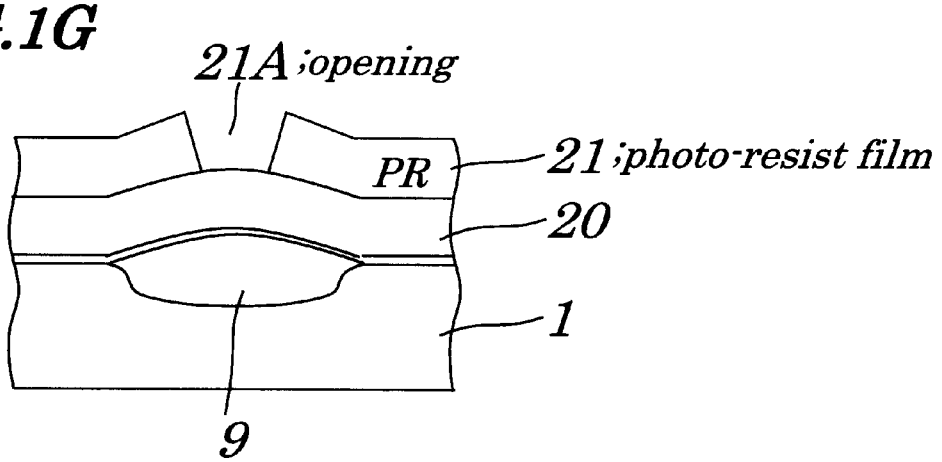

Next, as shown in FIG. 1G, almost the same processing as that of FIG. 1B is performed to form a photo-resist film 21 having a pattern in which an opening 21A with a set width dimension of 270–350 nm smaller than that of the above-mentioned opening 6A only above the first field oxide film 9 which constitutes part of the element isolating region.

Figure 1H:
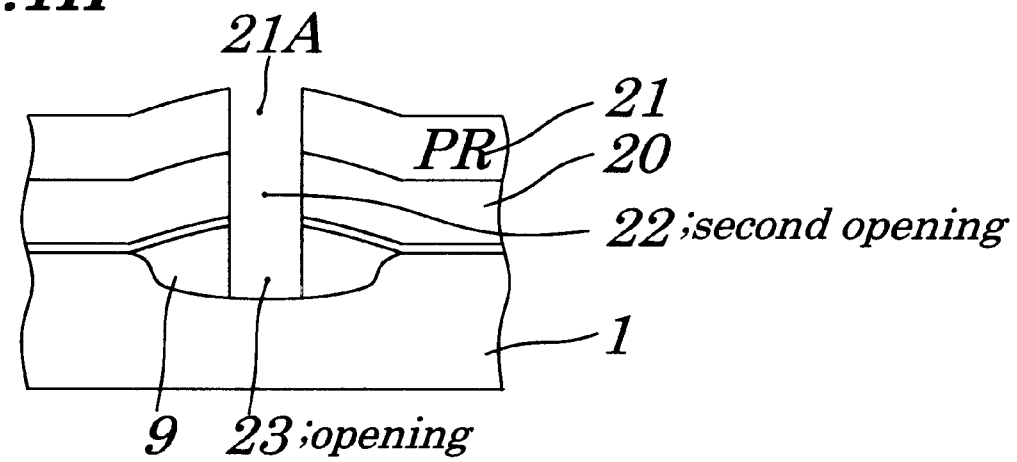
FIGS. 1H to 1J are further continued flow diagrams for sequentially showing the steps of the semiconductor device manufacturing method according to the first embodiment of the invention.

Next, as shown in FIG. 1H, using the photo-resist film 21 as a mask, the silicon nitride film 20 and the silicon oxide film 10 are selectively dry-etched and patterned in this order to thereby form a second opening 22 having roughly a same dimension as that of the opening 21A. Subsequently, the first field oxide film 9 is dry-etched selectively around at its middle to thereby form an opening 23 having roughly a same width dimension of 270–350 nm as that of the second opening 22. Next, the photo-resist film 21 is removed. In this step, the opening 23 can be arbitrarily formed in width and depth like the above-mentioned recess 8. Thus, by changing properly the width and the depth of the recess 8 or the opening 23 according to the film thickness of the field oxide film to be formed, improvements are assured in suppression of bite-in of the bird's beak into the element region and the flattening of the surface of the element region.

Figure 1I:
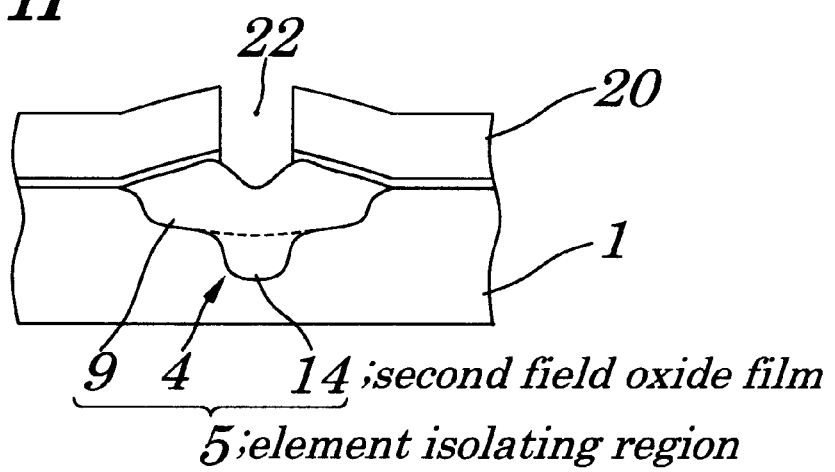

Next, as shown in FIG. 1I, the silicon substrate 1 is heat treated, as exposed in an oxidizing atmosphere, at 1000–1100° C. for 30–40 minutes as a second field oxidation. This permits the silicon nitride film 20 having the second opening 22 therein to be used as a mask to thereby locally form a second field oxide film 14 with a film thickness of 450–500 nm which overlaps with the first field oxide film 9 and also which is located at a center position corresponding to the opening 23 on the surface of the silicon substrate 1 exposed through the opening 23 in the first field oxide film 9. As a result, in the element-isolating formation-expected region 4 is formed an element isolating region 5 made up of the first field oxide film 9 and the second field oxide film 14.

By this method there is set such a width dimensional relationship as (first opening 7>second opening 22) between the first opening 7 in the silicon nitride film 3 used as the mask in formation of the first field oxide film 9 and the second opening 22 in the silicon nitride film 20 used as the mask in formation of the second field oxide film 14, so that the second field oxide film 14 is formed smaller in width than the first field oxide film 9. That is, the bird's beak of the second field oxide film 14 bites into the element region less than that of the first field oxide film 9 does. Also, the bite-in depth of the bird's beak 9A of the first field oxide film 9 can be suppressed to a reduced level because the first field oxide film 9 is originally formed thin. Also, by changing the first field oxidation conditions for forming this first field oxide film 9, the film thickness of the first field oxide film 9 can be controlled arbitrarily.

Figure 1J:
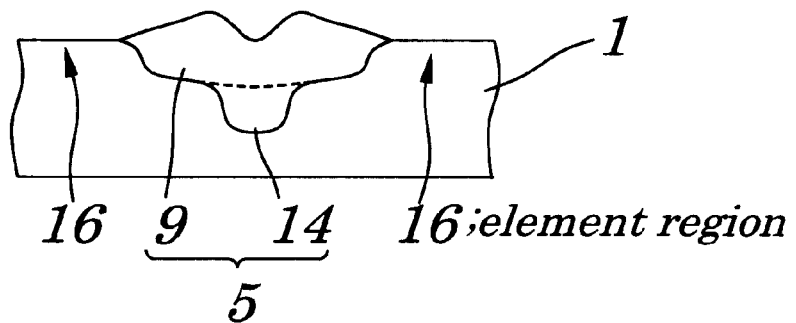

Next, as shown in FIG. 1J, the silicon oxide film 10 and the silicon nitride film 20 are removed to thereby obtain such the silicon substrate 1 that has, formed thereon, a plurality of element regions 16 dielectrically isolated from each other by the element isolating region made up of the thinner first field oxide film 9 and the thicker second field oxide film 14.

Afterwards, thus obtained silicon substrate 1 undergoes impurity introduction, etching, and other necessary processes repeatedly, so that desired circuit elements are formed in the element region 16, thus completing a semiconductor device.

The reason why the bite-in depth of the bird's beak is reduced by this method is that the opening can be formed by photolithography to thereby provide a larger distance between a silicon nitride film edge and a silicon oxide film edge of the mask.

In this step of this example, it is not always necessary to form the recess 8 or the opening 23. If, for example, the field oxide film is formed extremely thin, the field oxide film can be formed almost flat without the recess 8 or the opening 23.

As shown in FIG. 1J, in the semiconductor device manufactured by this semiconductor device manufacturing method according to this embodiment, the plurality of the element regions 16 is dielectrically isolated from each other by the element isolating region 5 selectively formed on the silicon substrate 1, which element isolating region 5 is made up of the first field oxide film 9 selectively formed at such a position in the element-isolating region formation-expected region 4 that is not covered with the first oxidation preventing film (silicon nitride film 3) having the opening 7 and the second field oxide film 14 which is selectively formed at such a position in the element-isolating region formation-expected region 4 that is not covered with the second oxidation preventing film (silicon nitride film 20) having therein the second opening 22 with a smaller width dimension than that of the above-mentioned first opening 7 and also which is so formed as to be thicker roughly at a middle of the first field oxide film 9.

As mentioned above, by this embodiment, the second field oxidation is performed using the silicon nitride film 20 having therein the second opening 22 having a set width dimension smaller than the first opening 7 formed in the silicon nitride film 3 used as a mask when the first field oxidation is performed, so that the second field oxide film 14 can be formed locally deeper only at around the middle of the first field oxide film 9. Therefore, the element isolating region 5 can be formed thick, thus maintaining sufficiently good element isolating characteristics. Also, the first field oxide film 9 can be formed thin, thus reducing a bite-in depth of the bird's beak 9A into the element region 16 to flatten its surface. Accordingly, channel region geometry is held flat in subsequent steps of forming a MOS-type transistor as the circuit element in the element region 16, thus suppressing fluctuations in properties of the MOS-type transistor.

Thus, by this semiconductor device manufacturing method according to the first embodiment, the first field oxidation can be performed by masking, on the silicon substrate 1, the element-isolation region formation-expected region 4 with the first oxidation preventing film (silicon nitride film 3) having the first opening 7 therein to thereby form the first field oxide film 9, which first field oxide film 9 is then masked by the second oxidation preventing film (silicon nitride film 20) having therein the second opening 22 with a set width smaller than that of the above-mentioned first opening 7 to thereby perform the second oxidation in order to locally the second field oxide film 14 deeper roughly at the middle of the first field oxide film 9, thus enabling controlling arbitrarily the film thickness of the element isolating region 5 around the element region 16.

Therefore, when forming the element isolating region 5 using LOCOS in two steps, the bird's beak 9A can be suppressed from biting deep into the element region 16 to thereby flatten its surface.

Second Embodiment

A semiconductor device manufacturing method according to the second embodiment of the invention largely differs in configuration from that according to the first embodiment in a respect that there are formed on a same substrate in a mixed manner a first circuit element requiring a thicker element isolating region and a second circuit element only requiring a thinner element isolating region. The following will describe this semiconductor device manufacturing method with reference to FIGS. 2A to 2J.

Figure 2A:
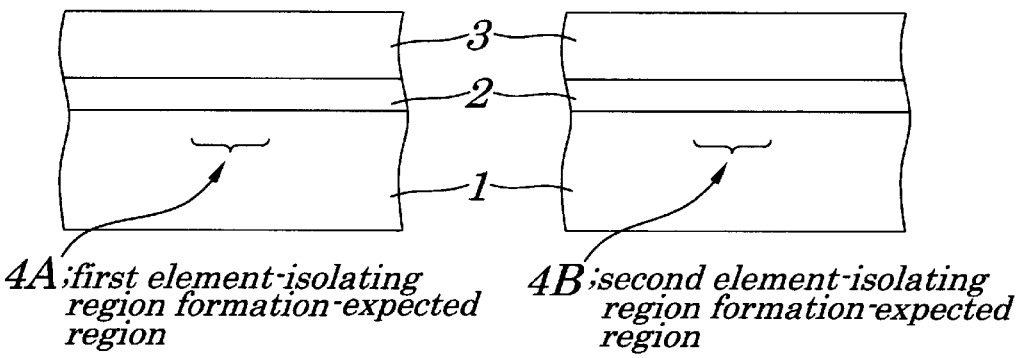
FIGS. 2A to 2D are flow diagrams for sequentially showing steps, in configuration, of a semiconductor device manufacturing method according to a second embodiment of the invention.

First, as shown in FIG. 2A, on a silicon substrate 1 is formed by thermal oxidation the silicon oxide film 2 with a film thickness of 18–22 nm as a pad insulating film and is then formed by CVD a silicon nitride film 3 with a film thickness of 130–170 nm as an oxidation preventing film. On the silicon substrate 1 are then defined a first element-isolating region formation-expected region 4A for a first circuit element requiring the thicker element isolating region and a second element-isolating region formation-expected region 4B for the second circuit element only requiring a thinner element isolating region.

Figure 2B:
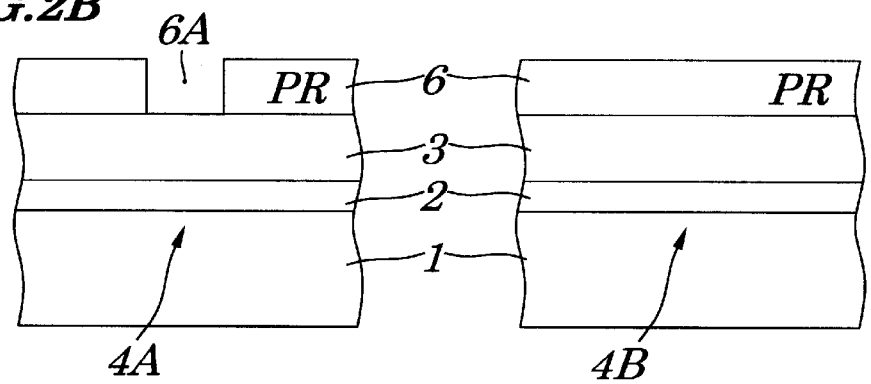

Next, as shown in FIG. 2B, a photo-resist is applied throughout on a surface by photolithography and then exposed and developed in order to form a photo-resist film 6 having such a pattern that an opening 6A with a width dimension of 600–750 nm is formed only above the first element-isolating region formation-expected region 4A.

Figure 2C:
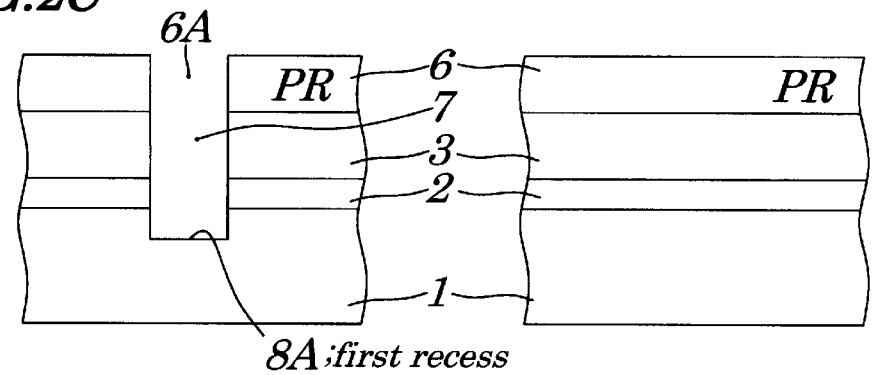

Next, as shown in FIG. 2C, using the photo-resist film 6 as a mask, the exposed silicon nitride film 3 and the silicon oxide film 2 are selectively dry-etched and patterned in this order to thereby form a first opening 7 with roughly a same dimension as the opening 6A, thus exposing the silicon substrate 1.

Subsequently, the surface of the silicon substrate 1 is selectively dry-etched to form a first recess 8A having roughly a same width dimension of 700–750 as that of the first opening 7 and a depth of 70–80 nm. Next, the photo-resist film 6 is removed. In this step, the recess 8A can be arbitrarily formed in width and depth.

Figure 2D:
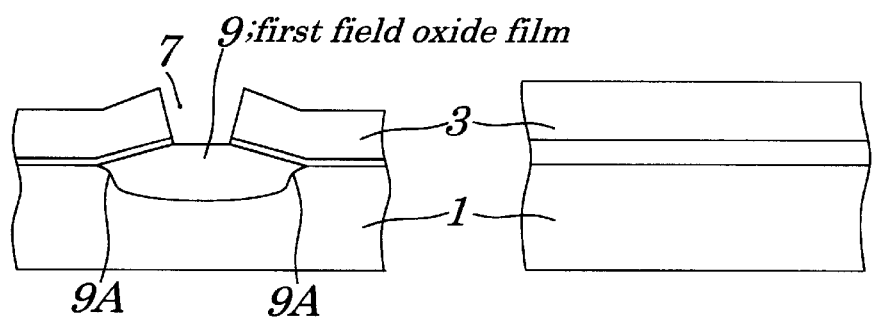

Next, as shown in FIG. 2D, the silicon substrate 1 is heat treated, as exposed an oxidizing atmosphere, at 1000–1100° C. for 20–30 minutes as the first field oxidation. This permits the silicon nitride film 3 having the first opening 7 therein to be used as a mask to thereby form a first field oxide film 9 with a film thickness of 270–350 nm and a width of 1.0–1.3 μm which constitutes part of the first element isolating region on the silicon substrate 1 in the first recess 8A of the first element-isolating region formation-expected region 4A. This first field oxide film 9 has a bird's beak 9A formed at its sides. Since the second element-isolation region formation-expected region 4B is covered with the silicon nitride film 3 during this first field oxidation, no field oxide film is formed. The silicon oxide film 2 is integrated with the first field oxide film 9.

Figure 2E:
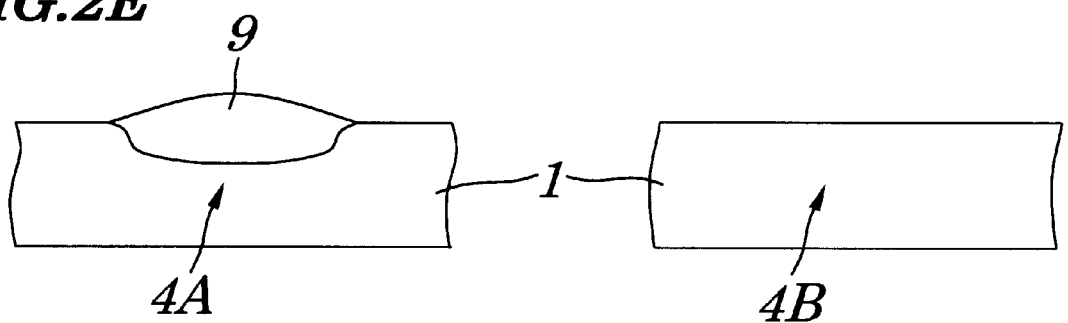
FIGS. 2E to 2G are continued flow diagrams for sequentially showing the steps of the semiconductor device manufacturing method according to the second embodiment of the invention.
Figure 2F:
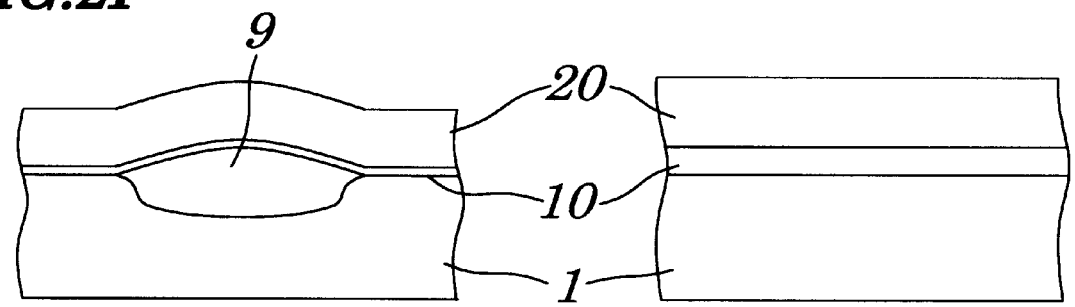

Next, as shown in FIG. 2E, the silicon oxide film 2 and the silicon nitride film 3 are removed by dry-etching or a like and then undergoes almost the same processing as the step of FIG. 2A, so that a silicon oxide film 10 with a film thickness of 18–22 nm as a new pad insulating film and a silicon nitride film 20 with a film thickness of 130–170 nm as a new oxidation preventing film are formed on the silicon substrate 1 including the first field oxide film 9 thereon as shown in FIG. 2F.

Figure 2G:
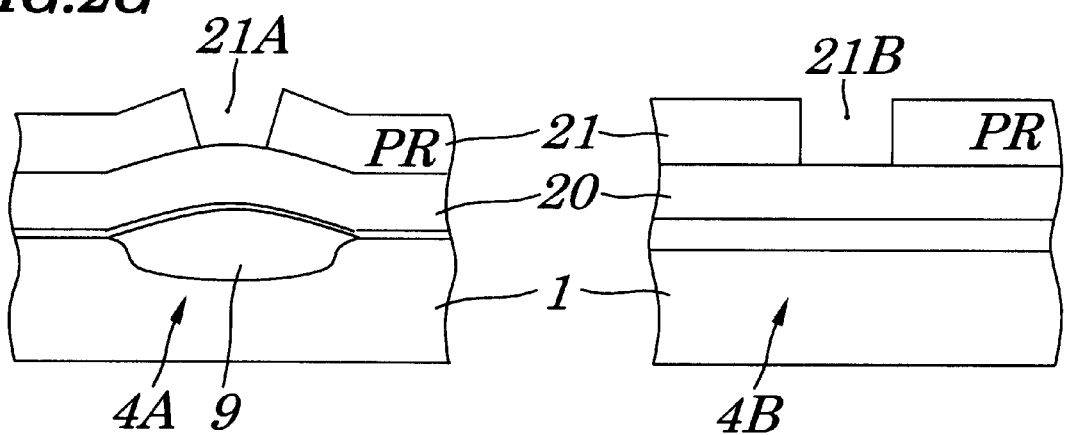

Next, as shown in FIG. 2G, almost the same processing as the step of FIG. 2B is performed to provide an opening 21A with a set width of 270–350 nm smaller than that of the above-mentioned opening 6A only above the first field oxide film 9 which constitutes part of the first element isolating region and also to form a photo-resist film 21 of such a pattern that has an opening 21B with a width dimension of 330–390 nm only above the above-mentioned second element-isolating region formation-expected region 4B.

Figure 2H:
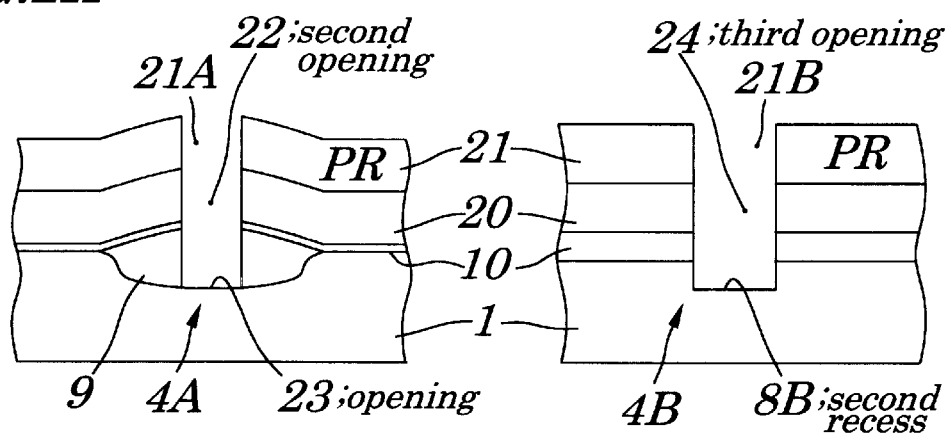
FIGS. 2H to 2J are further continued flow diagrams for sequentially showing the steps of the semiconductor device manufacturing method according to the second embodiment of the invention.

Next, as shown in FIG. 2H, the photo-resist film 21 is used as a mask to thereby selectively dry-etch and pattern the exposed silicon nitride film 20 and the silicon oxide film 10 in this order, thus forming a second opening 22 with roughly a same dimension as the opening 21A in the first element-isolating region formation-expected region 4A.

Subsequently, the first field oxide film 9 is dry-etched selectively at around its middle to thereby form an opening 23 with roughly a same width dimension of 270–350 nm as the second opening 22. At the same time, a third opening 24 with roughly a same dimension as the opening 21B is formed in the second element-isolating region formation-expected region 4B. Subsequently, the surface of the silicon substrate 1 is dry-etched selectively to thereby form a second recess 8B having roughly a same width dimension of 330–390 nm as the third opening 24 and a depth of 70–80 nm. Next, the photo-resist film 21 is removed. In this step, the second recess 8B and the opening 23 can be formed arbitrarily in width and depth.

Figure 2I:
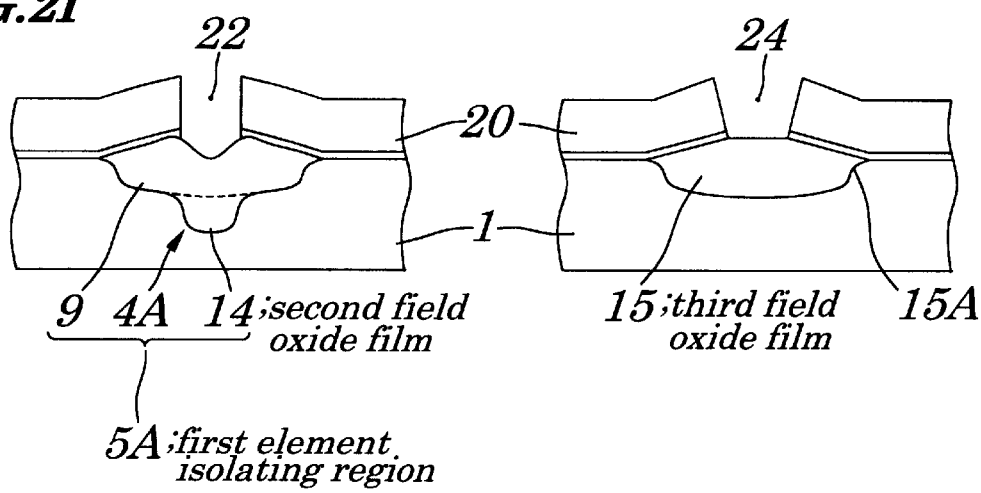

Next, as shown in FIG. 2I, the silicon substrate 1 is heat treated, as exposed in an oxidizing atmosphere, at 1000–1100° C. for 30–40 minutes as the second field oxidation. This permits the silicon nitride film 20 having the second opening 22 therein to be used as a mask to thereby locally form a second field oxide film 14 with a film thickness of 450–500 nm which overlaps with the first field oxide film 9 and also which is located at a center position corresponding to the opening 23 at such a position in the first element-isolating region formation-expected region on the surface of the silicon substrate 1 that is exposed through the opening 23 of the first field oxide film 9. As a result, in the first element-isolating region formation-expected region 4A is formed a first element isolating region 5A made up of the first field oxide film 9 and the second field oxide film 14. At the same time, the silicon nitride film 20 having the third opening 24 therein is used as a mask to thereby form a third field oxide film 15 having a film thickness of 330–380 nm and a width of 0.6–0.8 μm on the surface of the silicon substrate 1 in the second recess 8B of the second element-isolating region formation-expected region 4B. This third field oxide film 15 provides a second element isolating region 5B and also has a bird's beak 15A formed at its sides.

Figure 2J:
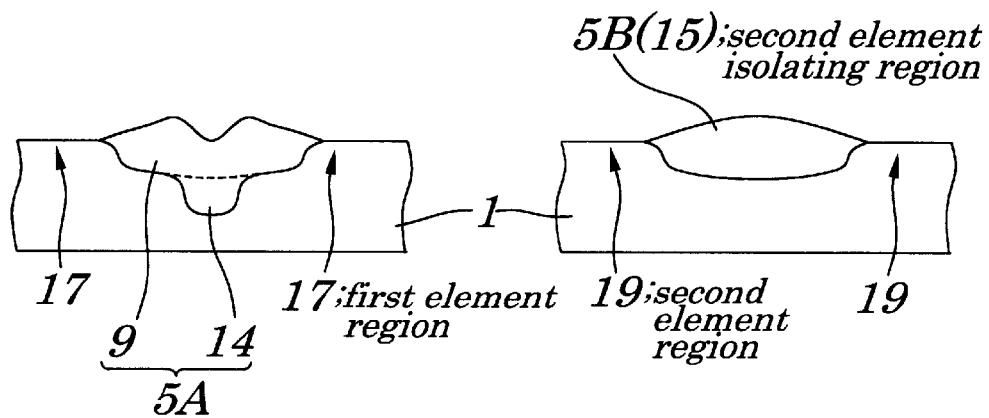

Next, as shown in FIG. 2J, the silicon oxide film 10 and the silicon nitride film 20 are removed to thereby form such silicon substrate 1 that has, formed thereon, a plurality of first element regions 17 dielectrically isolated from each other by the first element isolating region 5A which is made up of the thinner first field oxide film 9 and the thicker second field oxide film 14 and a plurality of second element regions 19 dielectrically isolated from each other by the second element isolating region 5B made up of the thinner third field oxide film 15.

Thereafter, thus obtained silicon substrate 1 undergoes necessary process steps such as impurity introduction, etching, or a like, so that the first circuit element requiring a high isolation dielectric strength is formed in the first element region 17 and the second circuit element only requiring a low isolation dielectric strength is formed in the second element region 19, thus completing a semiconductor device.

In this embodiment also, as mentioned in the first embodiment, it is not always necessary to form the first recess 8A, the second recess 8B, or the opening 23.

As described above, by this embodiment, not only it is possible to apply almost the same steps as the first embodiment to the first element-isolating region formation-expected region 4A for the first circuit element requiring a thicker element isolating region to thereby form the thicker first element isolating region 5A without a deep bite-in to the element region but also is it possible to form the thinner second element isolating region 5B in the second element-isolating region formation-expected region 4B only requiring a thinner element isolating region, thus suppressing the bird's beak from biting deep into the element region. Further, by this embodiment, a semiconductor device can be manufactured by almost the same number of steps as the prior art semiconductor device manufacturing method described with reference to FIGS. 6A to 6H, thus avoiding an increase in the manufacturing costs. The reason why this embodiment can suppress a deep bite-in of the bird's beak is the same as that described with the first embodiment.

Thus, the above-mentioned configuration of this embodiment also provides almost the same effects as those described with the first embodiment.

In addition, by this configuration of the second embodiment, the number of steps required for forming the element isolating regions with different film thicknesses is not increased as compared to that by the prior art, thus enabling easily providing on the same substrate a plurality of circuit elements having different isolation dielectric strengths.

Third Embodiment

A semiconductor device manufacturing method according to the third embodiment differs greatly in configuration from that according to the above-mentioned first embodiment is that in formation of a circuit element requiring a thick element isolating region on a silicon substrate, first a thicker field oxide film is formed and then a thinner field oxide film is formed. The following will describe this semiconductor device manufacturing method with reference to FIGS. 3A to 3H.

Figure 3A:
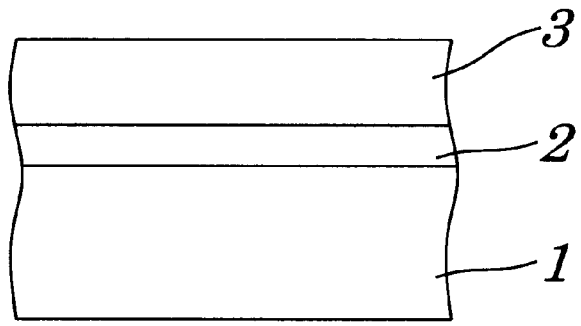
FIGS. 3A to 3C are flow diagrams for sequentially showing steps, in configuration, of a semiconductor device manufacturing method according to a third embodiment of the invention.

First, as shown in FIG. 3A, on a silicon substrate 1 is formed by thermal oxidation a silicon oxide film 2 with a film thickness of 18–22 nm as a pad insulating film and then is formed by CVD a silicon nitride film 3 with a film thickness of 130–170 nm as an oxidation preventing film.

Figure 3B:
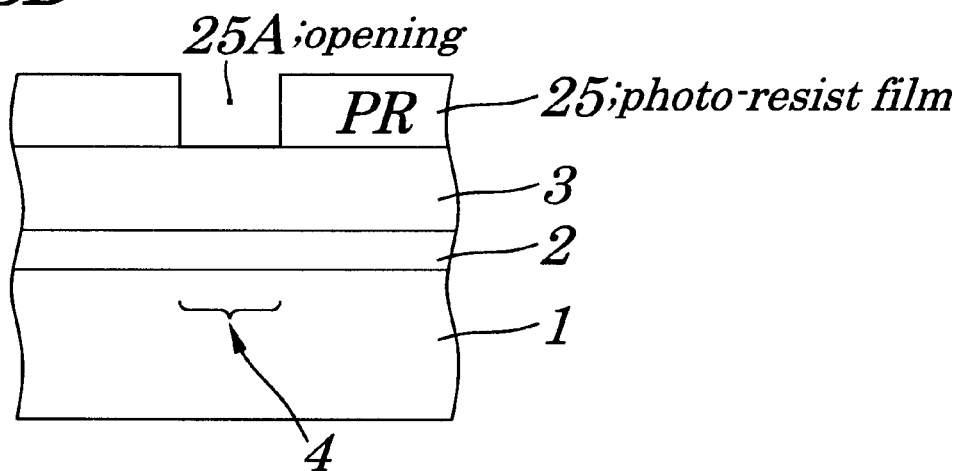

Next, as shown in FIG. 3B, a photo-resist is applied throughout on a surface by photolithography and then exposed and developed to thereby form a photo-resist film 25 of such a pattern that has an opening 25A with a width dimension of 270–350 nm only above an element-isolating region formation-expected region 4.

Figure 3C:
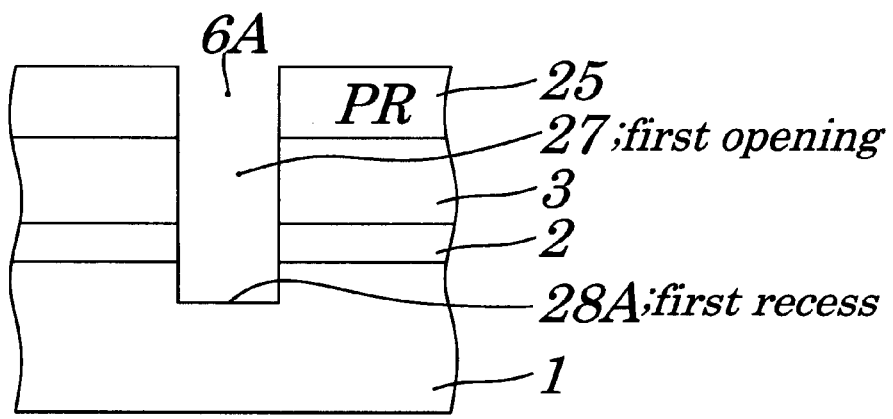

Next, as shown in FIG. 3C, the photo-resist film 25 is used as a mask to thereby dry-etch and pattern the exposed silicon nitride film 3 and the silicon oxide film 2 in this order, thus forming a first opening 27 with roughly a same dimension as the opening 25A to expose the silicon substrate 1 therethrough.

Subsequently, the surface of the silicon substrate 1 is selectively dry-etched to form a first recess 28A having roughly a same width dimension of 270–350 nm as the first opening 27 and a depth of 70–80 nm. Next, the photo-resist film 25 is removed. In this step, the first recess 28A can be formed arbitrarily in width and depth.

Figure 3D:
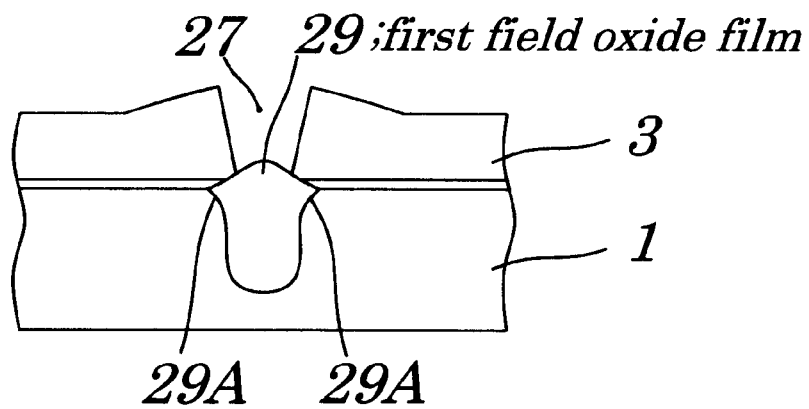
FIGS. 3D to 3F are continued flow diagrams for sequentially showing the steps of the semiconductor device manufacturing method according to the third embodiment of the invention.

Next, as shown in FIG. 3D, the silicon substrate 1 is heat treated, as exposed in an oxidizing atmosphere, at 1000–1100° C. for 30–40 minutes as the first field oxidation. This permits the silicon nitride film 3 having the first opening 27 therein to be used as a mask to thereby locally form a first field oxide film 29 having a film thickness of 270–350 nm and a width of 0.5–0.7 $\mu$m on the surface of the silicon substrate 1 in the first recess 28A of the element-isolating region formation-expected region 4. This first field oxide film 29 has a bird's beak 29A formed at its sides. The silicon oxide film 2 is integrated with the first field oxide film 29.

Figure 3E:
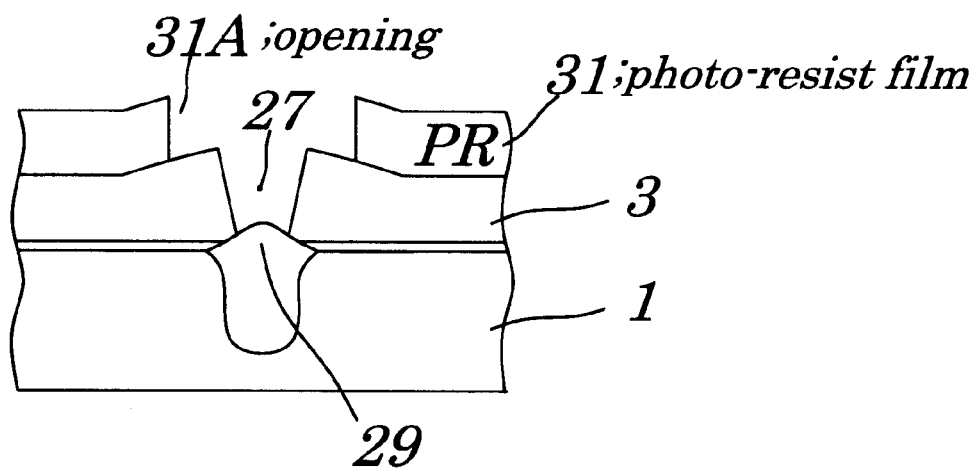

Next, as shown in FIG. 3E, almost the same processing as the step of FIG. 3B is performed to form a photo-resist film 31 of such a pattern that has therein an opening 31A with a set width dimension of 700–750 nm larger than that of the above-mentioned opening 25A only above the first field oxide film 29 which constitutes part of the element isolating region. This exposes only the surrounding area of the first opening 27 in the silicon nitride film 3.

Figure 3F:
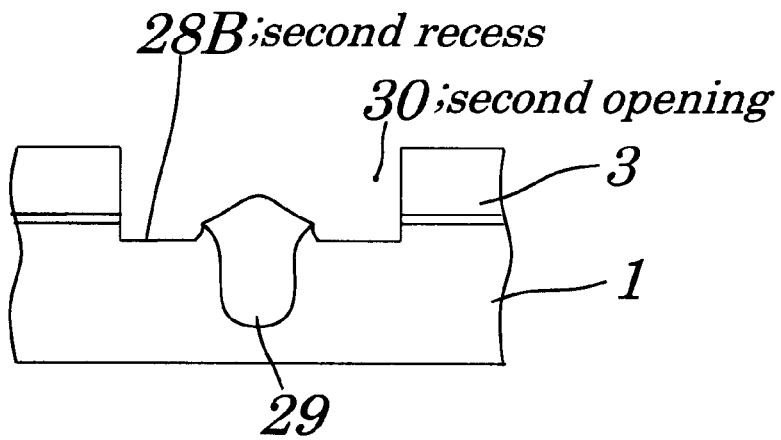

Next, as shown in FIG. 3F, the photo-resist film 31 is used as a mask to thereby dry-etch and pattern the exposed silicon nitride film 3 and the silicon oxide film 2 in this order, thus forming a second opening 30 with roughly a same dimension as the opening 31A. Subsequently, the surrounding area of the first field oxide film 29 is selectively dry-etched to form a second recess 28B which has roughly a same width dimension of 700–750 nm as that of the second opening 30 and a depth of 70–80 $\mu$m. Next, the photo-resist film 31 is removed. In this step, the second recess 28B can be arbitrarily formed in width and depth.

Figure 3G:
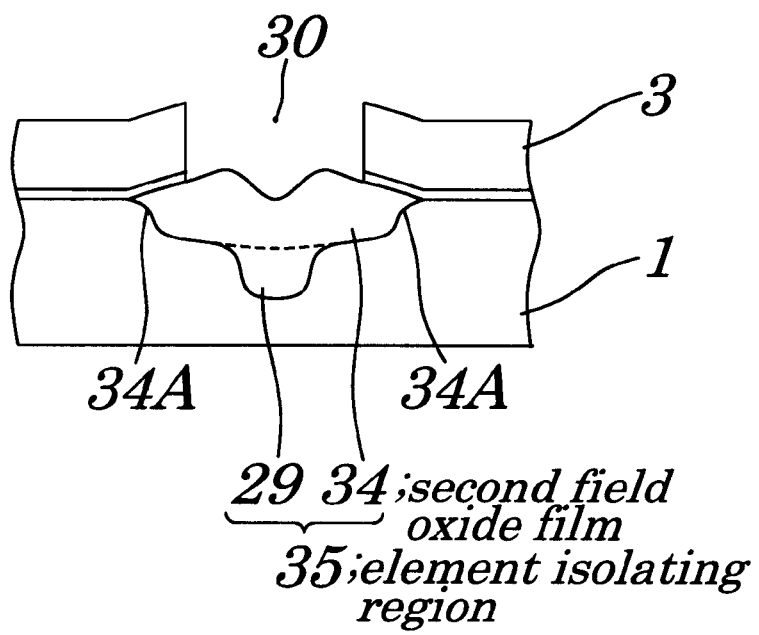
FIGS. 3G and 3H are further continued flow diagrams for sequentially showing the steps of the semiconductor device manufacturing method according to the third embodiment of the invention.

Next, as shown in FIG. 3G, the silicon substrate 1 is heat treated, as exposed in an oxidizing atmosphere, at 1000–1100° C. for 20–30 minutes as the second field oxidation. This permits the silicon nitride film 3 having the second opening 30 therein to be used as a mask to thereby form a second field oxide film 34 with a film thickness of 270–350 nm which overlaps with the first field oxide film 29 and also which is located at the surrounding to the first field oxide film 29 corresponding to the second opening 30 on the surface of the silicon substrate 1. This second field oxide film 34 has a bird's beak 34A formed at its sides. As a result, in the element-isolating region formation-expected region 4 is formed an element isolating region 35 made up of the first field oxide film 29 and the second field oxide film 34. In this step, the silicon oxide film 2 is integrated with the second field oxide film 34.

By this method, there is such a set width dimensional relationship as (first opening 27<second opening 30) between the first opening 27 in the silicon nitride film 3 used as the mask in the first field oxidation and the second opening 30 in the silicon nitride film 3 used as the mask in the second field oxidation, so that the first field oxide film 29 is formed smaller in width than the second field oxide film 34. That is, the bird's beak 29A of the first field oxide film 29 bites into the element region less than that of the second field oxide film 34 does. Also, the bite-in depth of the bird's beak 34A of the second field oxide film can be reduced because the second field oxide film 34 is originally formed thin. Also, by changing the second field oxidation conditions for forming this second field oxide film 34, the film thickness of the second field oxide film 34 can be controlled arbitrarily.

The reason why the bite-in depth of the bird's beak can be reduced by this embodiment is the same as that described with the first embodiment.

Figure 3H:
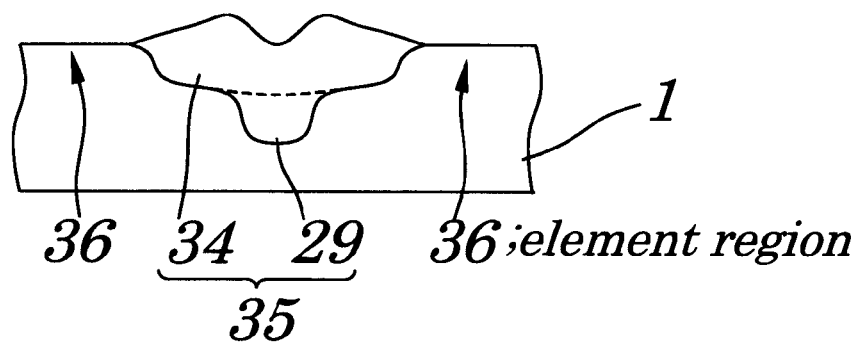

Next, as shown in FIG. 3H, the silicon oxide film 2 and the silicon nitride film 3 are removed to thereby obtain such a silicon substrate 1 that has, formed thereon, a plurality of element regions 36 dielectrically isolated from each other by the element isolating region 35 made up of the thicker first field oxide film 29 and the thinner second field oxide film 34. In this embodiment also, as described with the first embodiment, it is not always necessary to form the first recess 28A or the second recess 28B.

As shown in FIG. 3H, in the semiconductor device manufactured by this semiconductor device manufacturing method, the plurality of element regions 36 is dielectrically isolated from each other by the element isolating region 35 formed selectively on the silicon substrate 1. The element isolating region 35 is made up of the second field oxide film 34 selectively formed at such a position in the element-isolating region formation-expected region 4 that is not covered with the second oxidation preventing film (silicon nitride film 3) having the second opening 30, and the first field oxide film 29 which is selectively formed at a such position in the above-mentioned second opening 30 in the element-isolating region formation-expected region 4 that is not covered with the first oxidation preventing film (silicon nitride film 3) having the first opening 27 with a smaller width dimension than the second opening 30 and also which is locally formed so as to be thicker at around the middle of the second field oxide film 34.

Thus, the configuration of this embodiment also provides almost the same effects as that described with the first embodiment.

In addition, the configuration of this embodiment enables forming an element isolating region excellent in flatness, thus finding itself advantageous in micro-lithography.

Fourth Embodiment

A semiconductor device manufacturing method according to the fourth embodiment of the invention greatly differs, in configuration, from that of the above-mentioned second embodiment in a respect that in providing, as mixed on a same substrate, a first circuit element requiring a thicker element isolating region and a second circuit element only requiring a thinner element isolating region, to form an element isolating region especially thick, first a thicker field oxide film is formed and then a thinner field oxide film is formed. The following will describe this semiconductor device manufacturing method along its steps with reference to FIGS. 4A to 4H.

Figure 4A:
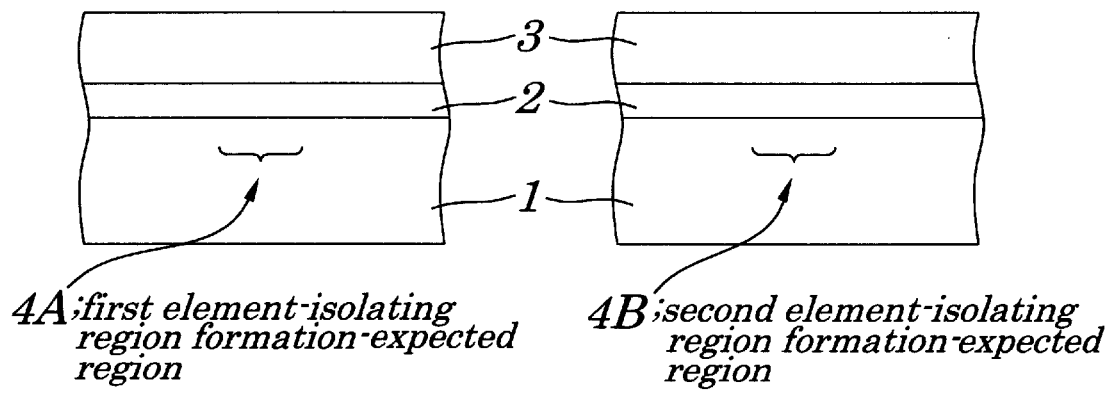
FIGS. 4A to 4C are flow diagrams for sequentially showing steps, in configuration, of a semiconductor device manufacturing method according to a fourth embodiment of the invention.

First, as shown in FIG. 4A, on a silicon substrate 1 is formed by thermal oxidation a silicon oxide film 2 with a film thickness of 18–22 nm as a pad insulating film and then is formed by CVD a silicon nitride film 3 with a film thickness of 130–170 nm as an oxidation preventing film. On the silicon substrate 1 is defined a first element-isolating region formation-expected region 4A for a first circuit element requiring a thicker element isolating region and a second element-isolating region formation-expected region 4B for a second circuit element only requiring a thinner element isolating region.

Figure 4B:
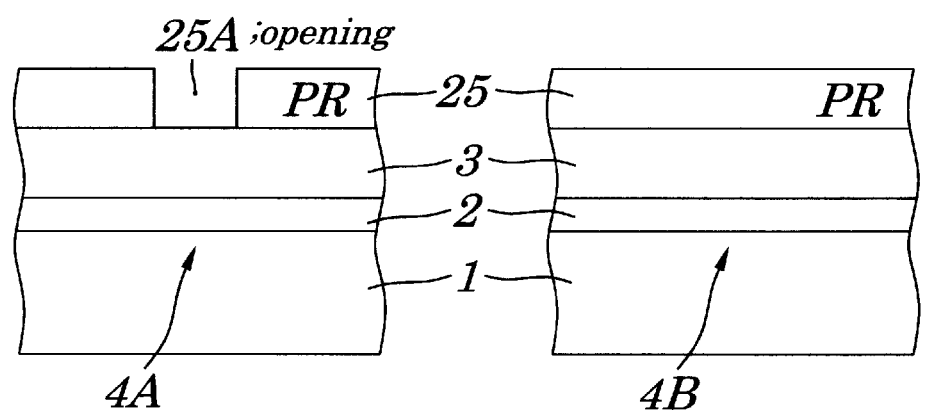

Next, as shown in FIG. 4B, a photo-resist is applied throughout on a surface by photolithography and then exposed and developed to thereby form a photo-resist film 25 of such a pattern that has an opening 25A with a width dimension of 270–350 nm only above the above-mentioned first element-isolating region formation-expected region 4A.

Figure 4C:
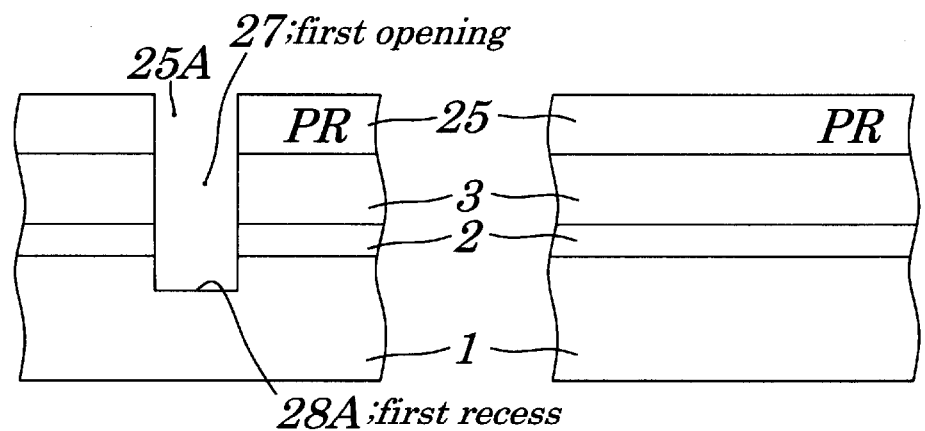

Next, as shown in FIG. 4C, the photo-resist film 25 is used as a mask to thereby selectively dry-etch and pattern the exposed silicon nitride film 3 and the silicon oxide film 2 in this order, thus forming a first opening 27 with roughly the same dimension as the opening 25A to expose the silicon substrate 1 therethrough.

Subsequently, the surface of the silicon substrate 1 is selectively dry-etched to thereby form a first recess 28A having roughly a same width dimension of 270–350 nm as that of the first opening 27 and a depth of 70–80 nm. Next, the photo-resist film 25 is removed. In this step, the first recess 28A can be formed arbitrarily in width and depth.

Figure 4D:
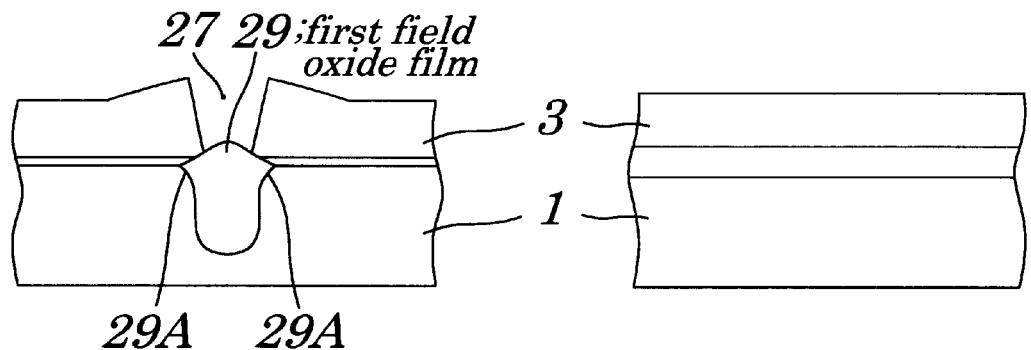
FIGS. 4D to 4F are continued flow diagrams for sequentially showing the steps of the semiconductor device manufacturing method according to the fourth embodiment of the invention.

Next, as shown in FIG. 4D, the silicon substrate 1 is heat treated, as exposed in an oxidizing atmosphere, at 1000–1100° C. for 20–30 minutes as the first field oxidation. This permits the silicon nitride film 3 having the first opening 27 therein to be used as a mask to thereby locally form a first field oxide film 29 with a film thickness of 270–350 nm and a width of 1.0–1.3 μm which constitutes part of a first element isolating region 35 on the surface of the silicon substrate 1 in the first recess 28A of the first element-isolating region formation-expected region 4A. This first field oxide film 29 has a bird's beak 29A at its sides. During this first field oxidation, the second element-isolating region formation-expected region 4B is covered with the silicon nitride film 3, so that no field oxide film is formed. In this step, the silicon oxide film 2 is integrated with the first field oxide film 29.

Figure 4E:
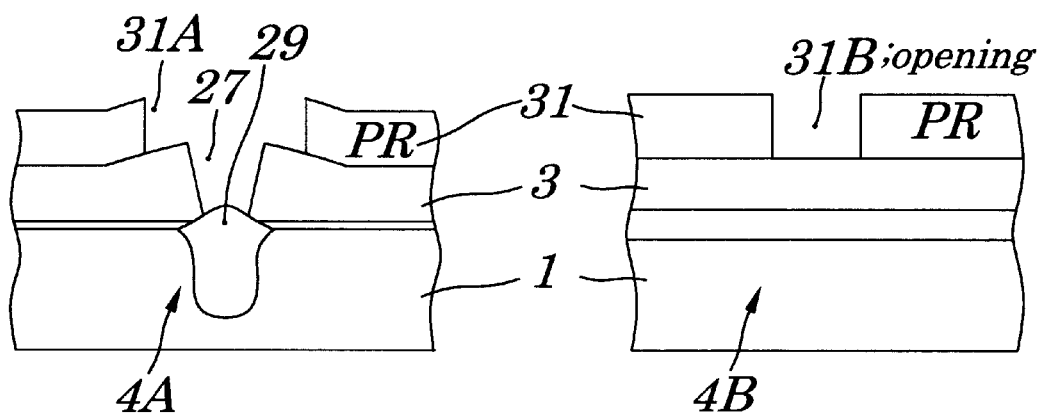

Next, as shown in FIG. 4E, almost the same processing as the step of FIG. 4B is performed to form a photo-resist film 31 of such a pattern that has an opening 31A with a set width dimension of 270–350 nm smaller than that of the above-mentioned opening 25A only above the first field oxide film 29 which constitutes part of the first element isolating region 35 and also has an opening 31B with a width dimension of 330–390 nm only above the above-mentioned second element-isolating region formation-expected region 4B. This exposes only the surrounding of the first opening 27 in the silicon nitride film 3.

Figure 4F:
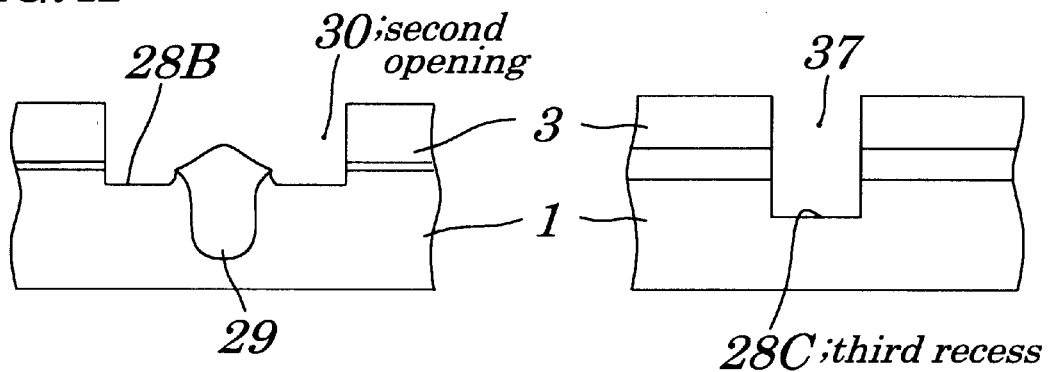

Next, as shown in FIG. 4F, the photo-resist film 31 is used as a mask to thereby selectively dry-etch and pattern the exposed silicon nitride film 3 and the silicon oxide film 2 in this order, thus forming a second opening 30 with roughly a same dimension as the opening 31A in the first element-isolating region formation-expected region 4A. Subsequently, the surrounding of the first field oxide film 29 is selectively dry-etched to form a second recess 28B having roughly a same width dimension of 700–750 nm as the second opening 30 and a depth of 70–80 μm. At the same time, a third opening 37 with roughly a same dimension as the opening 31B is formed in the second element-isolating region formation-expected region 4B. The surface of the silicon substrate 1 is selectively dry-etched to form a third recess 28C having roughly a same width dimension of 330–390 nm as the third opening 37 and a depth of 70–80 nm. Next, the photo-resist film 31 is removed. In this step, the third recess 28C and the silicon third opening 37 can be formed arbitrarily in width and depth.

Figure 4G:
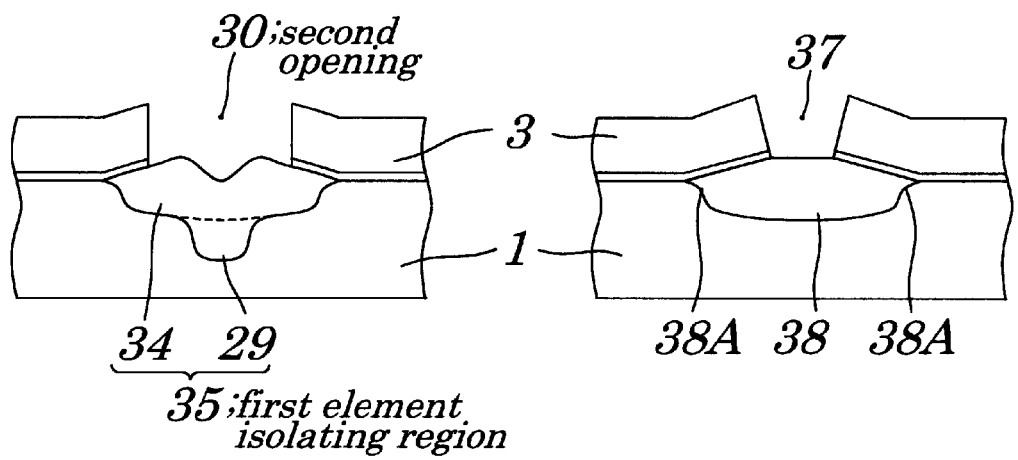
FIGS. 4G and 4H are further continued flow diagrams for sequentially showing the steps of the semiconductor device manufacturing method according to the fourth embodiment of the invention.

Next, as shown in FIG. 4G, the silicon substrate 1 is heat treated, as exposed in an oxidizing atmosphere, at 1000–1100° C. for 20–30 minutes as the second field oxidation. This permits the silicon nitride film 3 having the second opening 30 therein to be used as a mask to thereby form a second field oxide film 34 with a film thickness of 270–350 nm and a width of 1.0–1.3 μm which overlaps with the first field oxide film 29 and also which is located at such a position in the surrounding of the first field oxide film 29 that corresponds to the second opening 30 in the second recess 28B of the element-isolating region formation-expected region 4 on the surface of the silicon substrate 1. This second field oxide film 34 has bird's beaks 34A formed at its sides. As a result, in the first element-isolating region formation-expected region 4A is formed the first element isolating region 35 made up of the first field oxide film 29 and the second field oxide film 34. In this step, the silicon oxide film 2 is integrated with the second field oxide film 34. At the same time, a third field oxide film 38 with a film thickness of 330–380 nm and a width of 0.6–0.8 μm is formed on the surface of the silicon substrate 1 in the third recess 28C of the second element-isolating region formation-expected region 4B. This third field oxide film 38 provides a second element-isolating region 39 and also has a bird's beak 38A formed at its sides.

Figure 4H:
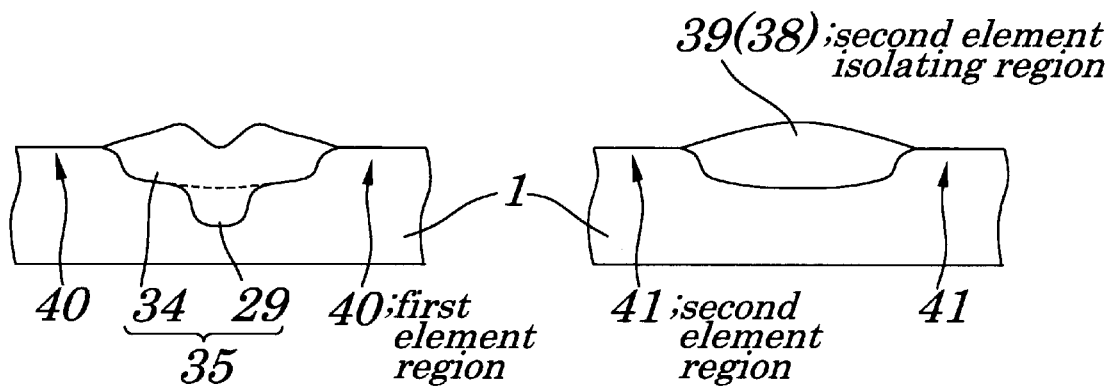
Figure 5A:
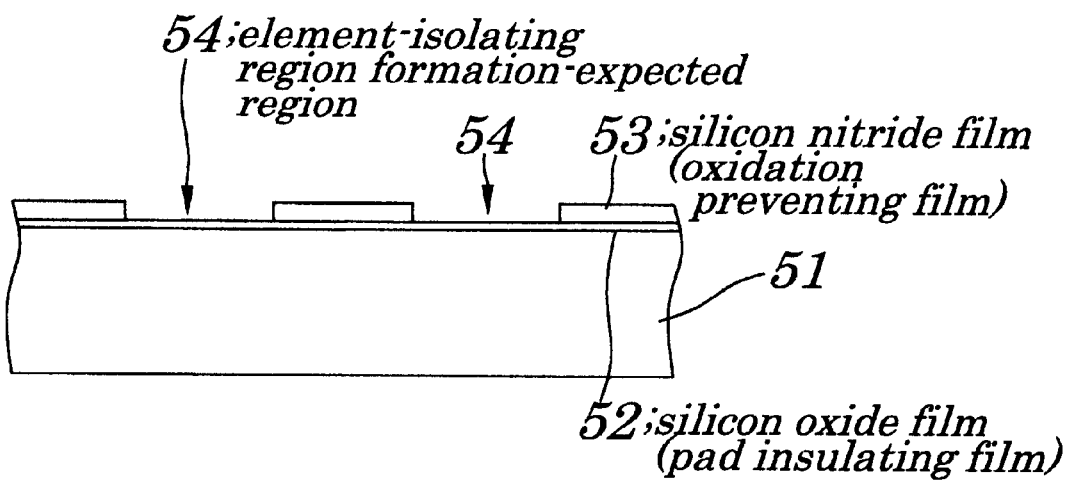
FIGS. 5A to 5C are flow diagrams for schematically showing an element isolating region forming method utilizing a LOCOS method.
Figure 5B:
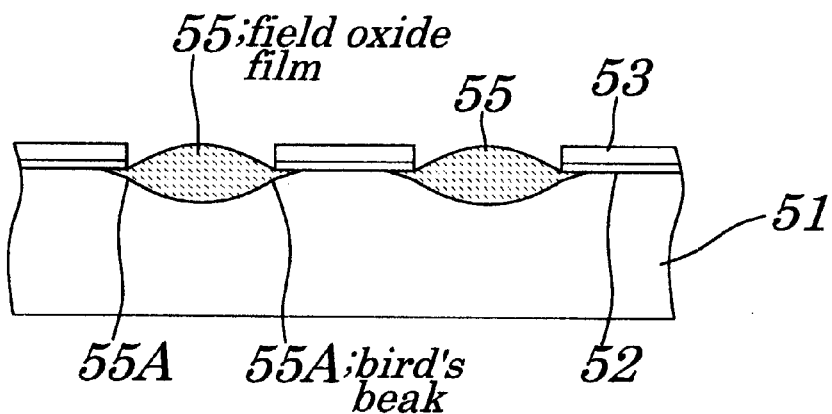
Figure 5C:
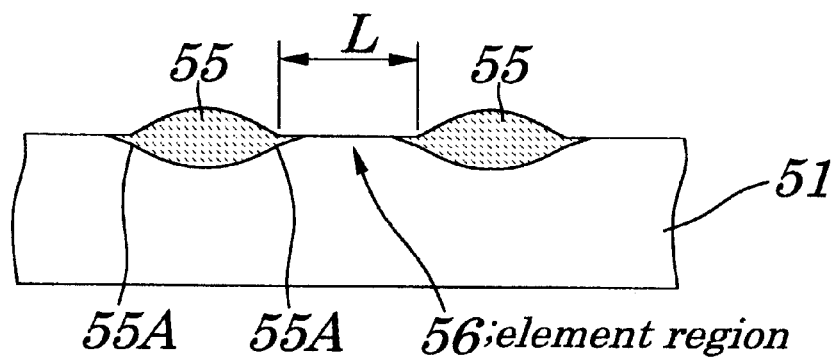
Figure 6A:
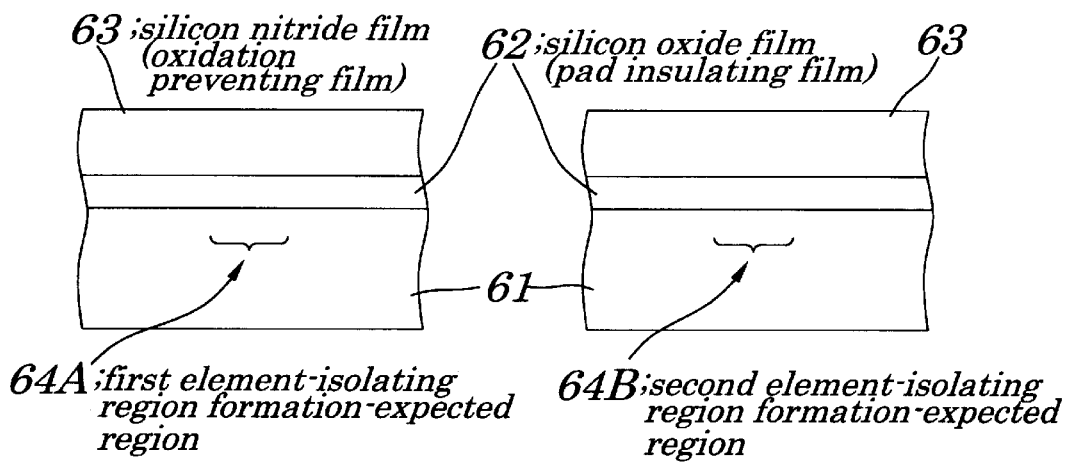
FIGS. 6A to 6D are flow diagrams for sequentially showing steps, in configuration, of a prior art semiconductor device manufacturing method.
Figure 6B:
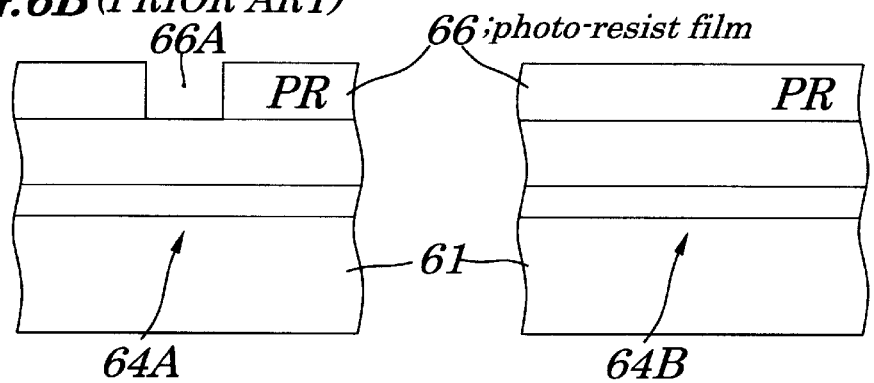
Figure 6C:
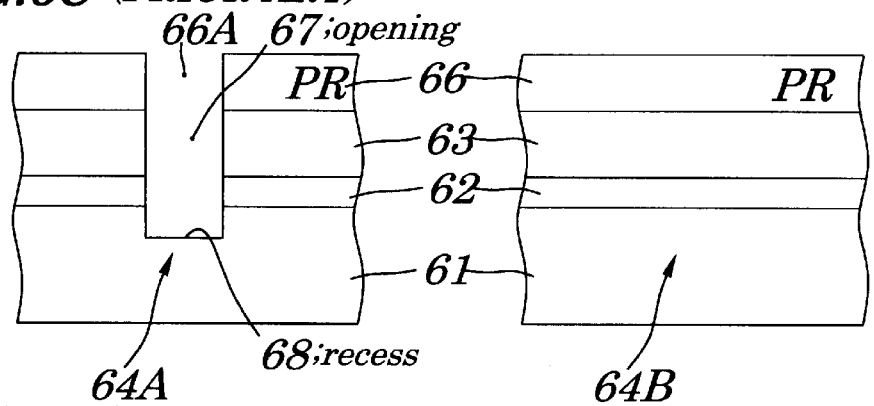
Figure 6D:
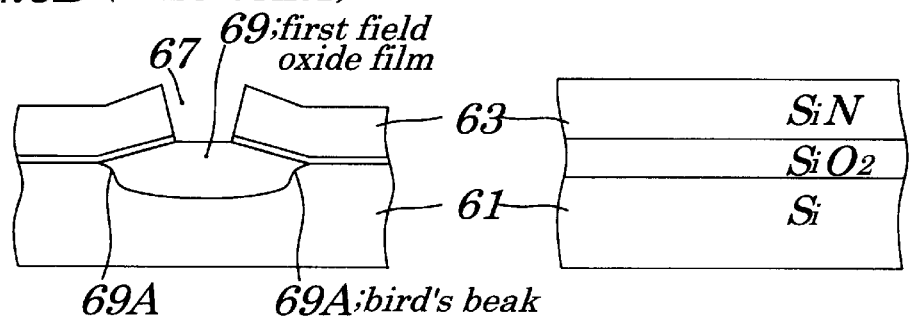
Figure 6E:
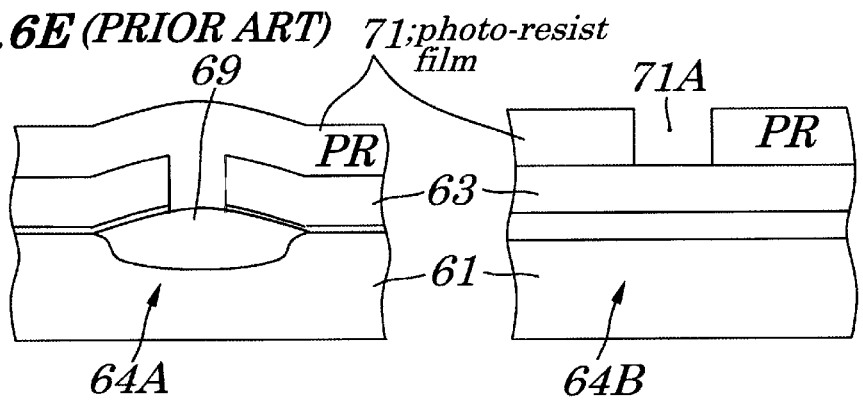
FIGS. 6E to 6H are continued flow diagrams for sequentially showing the steps, in configuration, of the prior art semiconductor device manufacturing method.
Figure 6F:
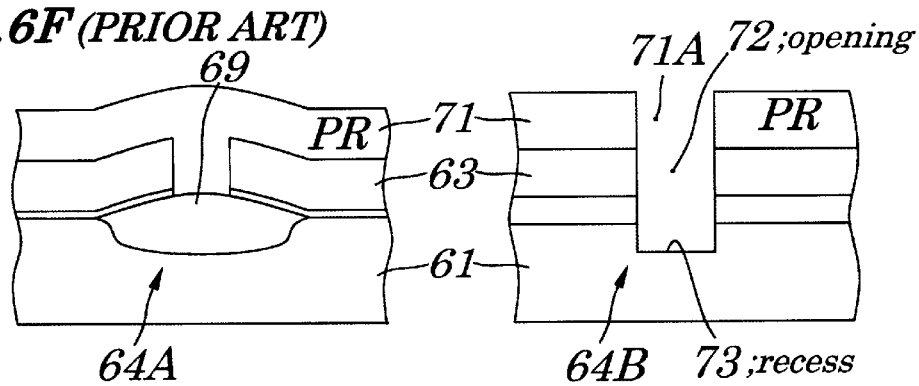
Figure 6G:
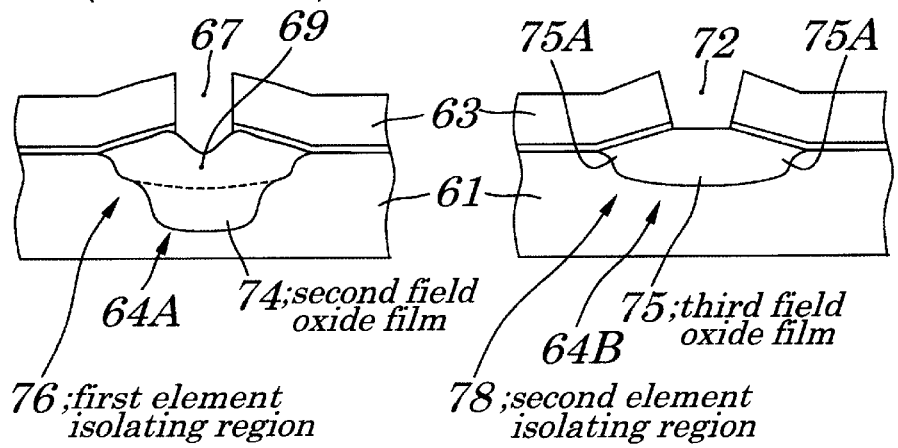
Figure 6H:
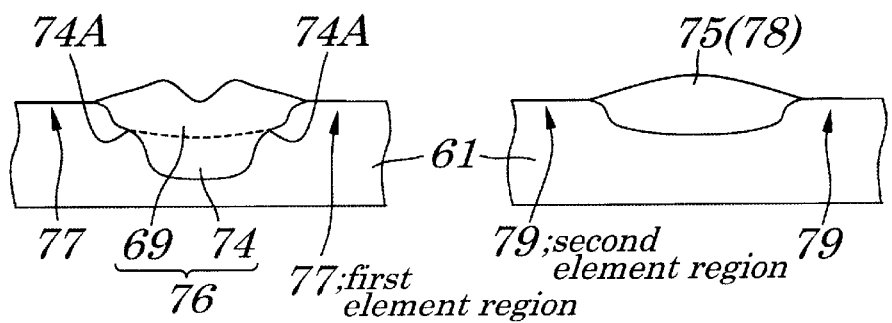
Figure 7A:
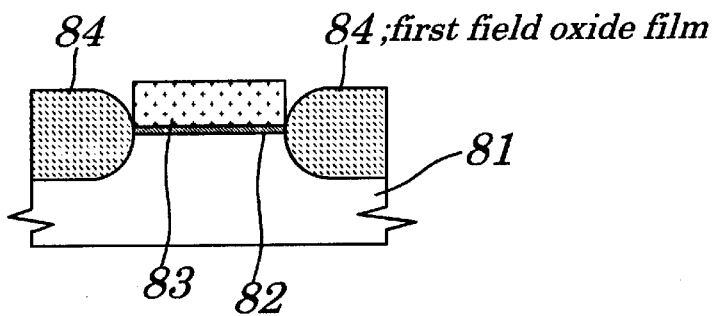
FIGS. 7A to 7D are flow diagrams for showing steps, in configuration, of another prior art semiconductor device manufacturing method.
Figure 7B:
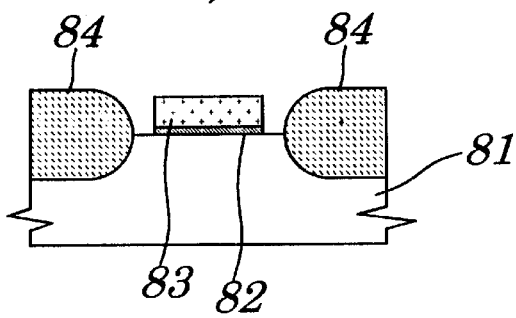
Figure 7C:
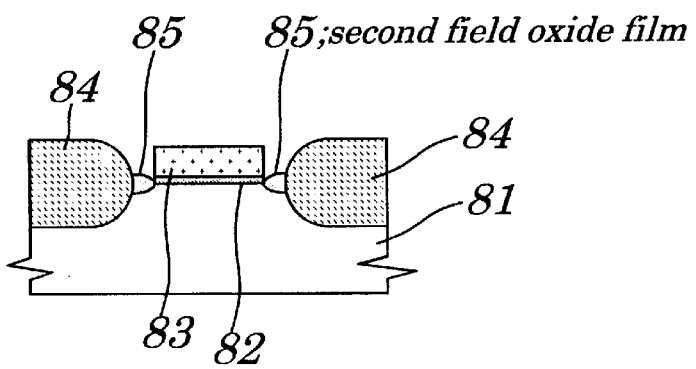
Figure 7D:
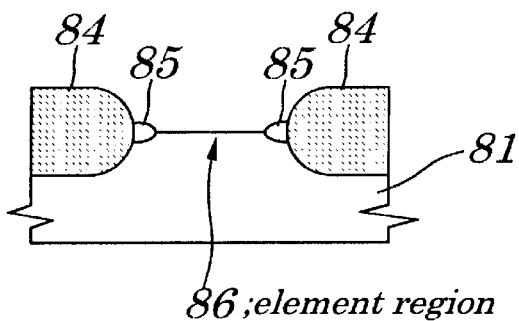
Figure 8A:
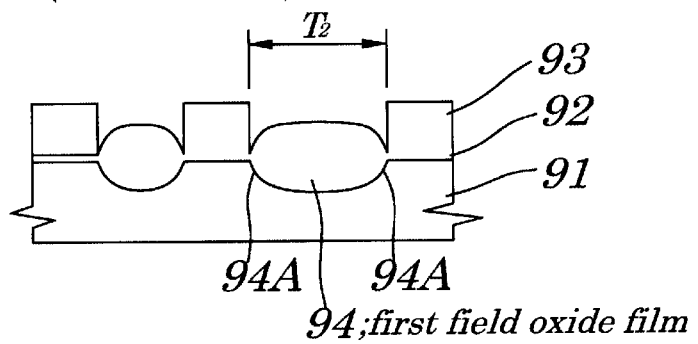
FIGS. 8A to 8E are flow diagrams for showing steps, in configuration, of further another prior art semiconductor device manufacturing method.
Figure 8B:
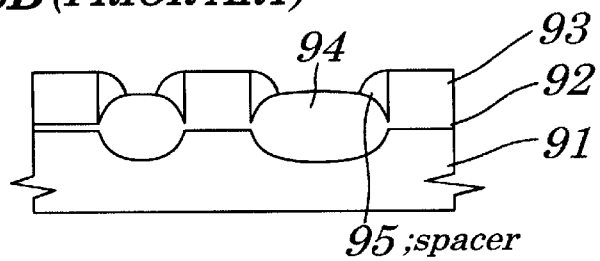
Figure 8C:
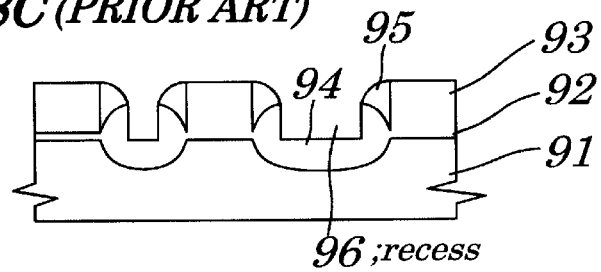
Figure 8D:
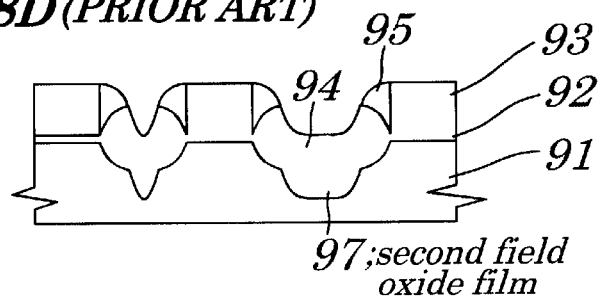
Figure 8E:
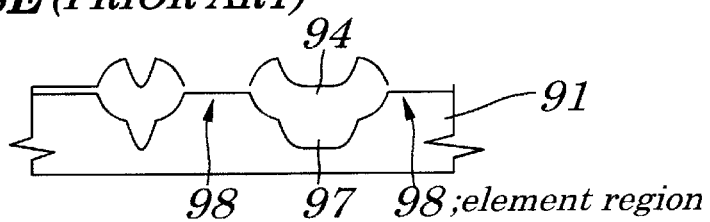
Figure 9A:
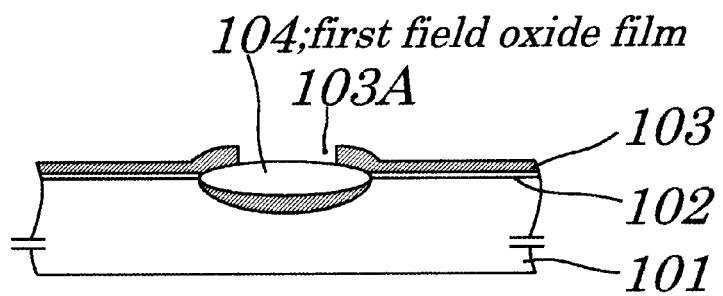
FIGS. 9A to 9D are flow diagrams for showing steps, in configuration, of still further another prior art semiconductor device manufacturing method.
Figure 9B:
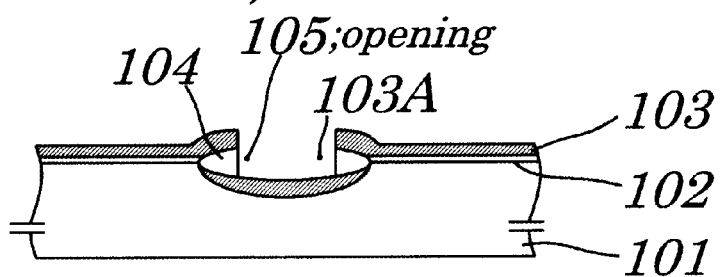
Figure 9C:
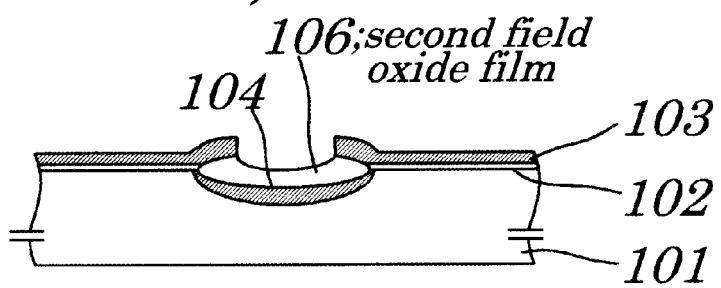
Figure 9D:
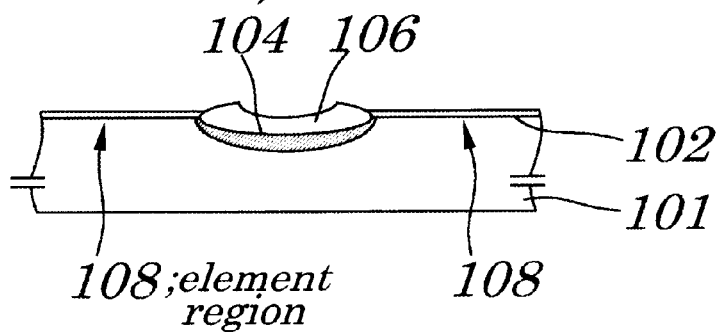

Next, as shown in FIG. 4H, the silicon oxide film 2 and the silicon nitride film 3 are removed to thereby form a plurality of first element regions 40 dielectrically isolated from each other by the first element isolating region 35 made up of the thicker first field oxide film 29 and the thinner second field oxide film 34 and also a plurality of second element regions 41 dielectrically isolated from each other by the second element isolating region 39 made up of the thinner third field oxide film 38. In this embodiment also, as described with the first embodiment, it is not always necessary to form the first recess 28A, the second recess 28B, or the third recess 28C.

As described above, by this embodiment, not only it is possible to apply almost the same step as that of the third embodiment to form the thicker first element isolating region 35 in the first element-isolating region formation-expected region 4A for the first circuit element requiring a thick element isolating region without a deep bite-in to the element region but also is it possible to form the thinner second element isolating region 39 in the second element-isolating region formation-expected region 4B for the second circuit element only requiring a thin element isolating region, thus suppressing the bird's beak from biting deep into the element region. Further, almost the same number of steps are required as that of the prior art semiconductor device manufacturing method described with reference to FIGS. 6A to 6H, thus avoiding an increase in the manufacturing costs. The reason why the bite-in depth of the bird's beak is reduced by this embodiment is the same as that described with the first embodiment.

Thus, the configuration of this embodiment also provides almost the same effects as those described with the second embodiment.

In addition, the configuration of this embodiment enables forming an element-isolating region excellent in flatness, thus finding itself advantageous in micro-lithography.

It is apparent that the present invention is not limited to the above embodiments but may be changed and modified without departing from the scope and spirit of the invention. For example, the dimension of the opening in the silicon nitride film used as the oxidation preventing film has been indicated only as an example and so may be changed with various uses and purposes. Also, the conductivity type of the semiconductor substrate may be of a P-type or an N-type. Also, although a MOS-type transistor has been used as the circuit element in the description, the gate insulating film is not limited in use to an oxide film and may be a nitride film or of a double configuration made up of oxide and nitride films. That is, as far as being a MIS-type transistor, the transistor employed here may be of a MOS-type transistor as well as an MNS—(Metal Nitride Semiconductor) type transistor or an MNOS—(Metal Nitride Oxide semiconductor) type transistor.

What is claimed is:

1. A semiconductor device manufacturing method for selectively forming an element isolating region on a semiconductor substrate so that said semiconductor substrate may be dielectrically isolated into a plurality of element regions by said element isolating region, comprising:

a first oxidation preventing film forming step of covering an element-isolating region formation-expected region on said semiconductor substrate with a first oxidation preventing film having a first opening therein;

a first field oxide film forming step of performing first field oxidation on said semiconductor substrate to thereby selectively form a first field oxide film at such a position in said element-isolating region formation-expected region that is not covered with said first oxidation preventing film;

a second oxidation preventing film forming step of removing said first oxidation preventing film to then cover said first field oxide film with a second oxidation preventing film having a second opening having a set width dimension smaller than said first opening; and a second field oxide film forming step of performing second field oxidation on said semiconductor substrate to thereby selectively form a second field oxide film which overlaps partially with said first field oxide film and also which is located deeper in level than said first field oxide film at such a position in said element-isolating region formation-expected region that corresponds to said second opening in said second oxidation preventing film.

2. The semiconductor device manufacturing method according to claim 1, further comprising a recess forming step of using said first oxidation preventing film as a mask to thereby form a recess in said first element-isolating region formation-expected region between said first oxidation preventing film forming step and said first field oxide film forming step.

3. The semiconductor device manufacturing method according to claim 2, wherein said recess can be changed in formation arbitrarily in width and depth.

4. A semiconductor device manufacturing method for selectively forming a first element isolating region with a larger film thickness and a second element isolating region with a smaller film thickness on a semiconductor substrate so that said semiconductor substrate may be dielectrically isolated into a plurality of element regions by said first element isolating region and said second element isolating region, comprising:

a first oxidation preventing film forming step of covering a first element-isolating region formation-expected region and a second element-isolating region formation-expected region on said semiconductor substrate with a first oxidation preventing film having a first opening therein in such a way that said first opening may be located above said first element-isolating region formation-expected region;

a first field oxide film forming step of performing first field oxidation on said semiconductor substrate to thereby selectively form a first field oxide film only at such a position in said first element-isolating region formation-expected region that is not covered with said first oxidation preventing film;

a second oxidation preventing film forming step of removing said first oxidation preventing film to then cover said semiconductor substrate with a second oxidation preventing film having a second opening and a third opening which have set width dimensions smaller than said first opening in such a way that said second opening may be located above said first field oxide film and also that said third opening may be located above said second element-isolating region formation-expected region; and a second and third field oxide film forming step of performing second field oxidation on said semiconductor substrate to thereby selectively form a second field oxide film which overlaps partially with said first field oxide film and also which is located deeper in level than said first field oxide film only at such a position in said first element-isolating region formation-expected region that corresponds to said second opening in said second oxidation preventing film and, at the same time, selectively forms a third field oxide film only at such a position in said second element-isolating region formation-expected region that corresponds to said third opening.

5. The semiconductor device manufacturing method according to claim 4, further comprising a recess forming step of using said first oxidation preventing film as a mask to thereby form a recess in said first element-isolating region formation-expected region between said first oxidation preventing film forming step and said first field oxide film forming step.

6. The semiconductor device manufacturing method according to claim 5, wherein said recess can be changed in formation arbitrarily in width and depth.

7. The semiconductor device manufacturing method according to claim 4, further comprising an other recess forming step of using said second oxidation preventing film as a mask to thereby form an other recess in said second element-isolating region formation-expected region between said second oxidation preventing film forming step and said second and third field oxide film forming steps.

8. The semiconductor device manufacturing method according to claim 7, wherein said recess can be changed in formation arbitrarily in width and depth.

9. A semiconductor device manufacturing method for selectively forming an element isolating region on a semiconductor substrate so that said semiconductor substrate may be dielectrically isolated into a plurality of element regions by said element isolating region, comprising:

a first oxidation preventing film forming step of covering an element-isolating region formation-expected region on said semiconductor substrate with a first oxidation preventing film having a first opening therein;

a first field oxide film forming step of performing first field oxidation on said semiconductor substrate to thereby selectively form a first field oxide film at such a position in said element-isolating region formation-expected region that is not covered with said first oxidation preventing film;

a second oxidation preventing film forming step of removing said first oxidation preventing film to then cover said first field oxide film with a second oxidation preventing film having a second opening therein which has a set width dimension larger than said first opening; and a second field oxide film forming step of performing second field oxidation on said semiconductor substrate to thereby selectively form a second field oxide film which overlaps partially with said first field oxide film and also which is located shallower in level than said first field oxide film at such a position in said element-isolating region formation-expected region that corresponds to said second opening in said second oxidation preventing film.

10. The semiconductor device manufacturing method according to claim 9, further comprising a recess forming step of using said first oxidation preventing film as a mask to thereby form a recess in said first element-isolating region formation-expected region between said first oxidation preventing film forming step and said first field oxide film forming step.

11. The semiconductor device manufacturing method according to claim 10, wherein said recess can be changed in formation arbitrarily in width and depth.

12. A semiconductor device manufacturing method for selectively forming a first element isolating region with a larger film thickness and a second element isolating region with a smaller film thickness on a semiconductor substrate so that said semiconductor substrate may be dielectrically isolated into a plurality of element regions by said first element isolating region and said second element isolating region, comprising:

a first oxidation preventing film forming step of covering a first element-isolating region formation-expected region and a second element-isolating region formation-expected region on said semiconductor substrate with a first oxidation preventing film having a first opening therein in such a way that said first opening may be located above said first element-isolating region formation-expected region;

a first field oxide film forming step of performing first field oxidation on said semiconductor substrate to thereby selectively form a first field oxide film only at such a position in said first element-isolating region formation-expected region that is not covered with said first oxidation preventing film;

a second oxidation preventing film forming step of removing said first oxidation preventing film to then cover said semiconductor substrate with a second oxidation preventing film having a second opening and a third opening which have set width dimensions larger than said first opening in such a way that said second opening may be located above said first field oxide film and also that said third opening may be located above said second element-isolating region formation-expected region; and a second and third field oxide films forming step of performing second field oxidation on said semiconductor substrate to thereby selectively form a second field oxide film which overlaps partially with said first field oxide film and also which is located shallower in level than said first field oxide film only at such a position in said first element-isolating region formation-expected region that corresponds to said second opening in said second oxidation preventing film and, at the same time, selectively form a third field oxide film only at such a position in said second element-isolating region formation-expected region that corresponds to said third opening.

13. The semiconductor device manufacturing method according to claim 12, further comprising a recess forming step of using said first oxidation preventing film as a mask to thereby form a recess in said first element-isolating region formation-expected region between said first oxidation preventing film forming step and said first field oxide film forming step.

14. The semiconductor device manufacturing method according to claim 13, wherein said recess can be changed in formation arbitrarily in width and depth.

15. The semiconductor device manufacturing method according to claim 12, further comprising another recess forming step of using said second oxidation preventing film as a mask to thereby form another recess in said second element-isolating region formation-expected region between said second oxidation preventing film forming step and said second and third field oxide films forming step.

16. The semiconductor device manufacturing method according to claim 15, wherein said recess can be changed in formation arbitrarily in width and depth.

* * * * *